(12) United States Patent
Joshua et al.

(10) Patent No.: US 11,792,956 B1
(45) Date of Patent: Oct. 17, 2023

(54) BELLOWS FOR IMMERSION COOLING

(71) Applicant: MTS IP Holdings Ltd, Grand Cayman (KY)

(72) Inventors: Nihal Joshua, Niagara Falls (CA);
Ioannis Manousakis, Zürich (CH);
Jimil Shah, Wylie, TX (US)

(73) Assignee: MTS IP Holdings Ltd, George Town (KY)

( * ) Notice: Subject to any disclaimer, the term of this patent is extended or adjusted under 35 U.S.C. 154(b) by 0 days.

(21) Appl. No.: 18/318,905

(22) Filed: May 17, 2023

Related U.S. Application Data

(63) Continuation of application No. PCT/US2023/067056, filed on May 16, 2023.

(51) Int. Cl.
*H05K 7/20* (2006.01)

(52) U.S. Cl.
CPC ......... *H05K 7/20327* (2013.01); *H05K 7/203* (2013.01)

(58) Field of Classification Search
CPC .............. H05K 7/203; H05K 7/20809; H05K 7/20236; H05K 7/20818; H05K 7/20327; H05K 5/068; H05K 7/20936; H05K 5/067; G06F 1/20; G06F 2200/201; G06F 1/181; H01L 23/44; H01L 23/4332; H01L 23/473
USPC ............ 361/700, 699, 679.53, 688; 257/714, 257/715, E23.095; 165/80.4, 104.33, 281
See application file for complete search history.

(56) References Cited

U.S. PATENT DOCUMENTS

| | | | | |
|---|---|---|---|---|
| 4,686,606 A | * | 8/1987 | Yamada | H01L 23/3736 257/E23.091 |
| 4,847,731 A | * | 7/1989 | Smolley | H01L 23/427 257/713 |
| 8,215,382 B2 | | 7/2012 | Schoonover | |
| 10,206,307 B2 | * | 2/2019 | Lau | H05K 7/203 |
| 10,206,308 B2 | | 2/2019 | Meijer et al. | |
| 10,244,650 B2 | * | 3/2019 | Laneryd | H01F 27/14 |
| 2008/0302115 A1 | | 12/2008 | Eknes et al. | |
| 2015/0060009 A1 | * | 3/2015 | Shelnutt | H05K 7/203 165/11.1 |
| 2017/0295670 A1 | * | 10/2017 | Campbell | H05K 7/2039 |
| 2018/0020570 A1 | * | 1/2018 | Fujiwara | H05K 7/20318 |
| 2018/0042138 A1 | * | 2/2018 | Campbell | H05K 7/203 |
| 2019/0170406 A1 | * | 6/2019 | Wilson | F25B 19/00 |
| 2021/0148643 A1 | * | 5/2021 | Tung | H01L 23/4332 |
| 2022/0400584 A1 | | 12/2022 | Enright et al. | |

OTHER PUBLICATIONS

Notice of Allowance for U.S. Appl. No. 18/318,888 dated Aug. 16, 2023, 8 pages.
U.S. Appl. No. 18/318,870, filed May 17, 2023, Joshua et al.
U.S. Appl. No. 18/318,888, filed May 17, 2023, Joshua et al.

\* cited by examiner

*Primary Examiner* — Mandeep S Buttar
(74) *Attorney, Agent, or Firm* — Smith Baluch LLP

(57) ABSTRACT

A bellows assembly and related methods are described. The bellows assembly can be used in a two-phase immersion cooling system to regulate pressure in a tank's airspace above a coolant liquid. The bellows assembly can include a flexible container and pressure-release valves located to reduce emissions of coolant liquid vapor into an ambient environment.

23 Claims, 9 Drawing Sheets

BELLOWS FOR IMMERSION COOLING

CROSS-REFERENCE TO RELATED APPLICATIONS

This application is a bypass continuation of international patent application No. PCT/US2023/067056, titled "Bellows for Immersion Cooling," and filed May 16, 2023.

BACKGROUND

As feature sizes and transistor sizes have decreased for integrated circuits (ICs), the amount of heat generated by a single chip, such as a microprocessor, has increased. Chips that once were air cooled have evolved to chips needing more heat dissipation than can be provided by air alone. In some cases, immersion cooling of chips in a coolant liquid is employed to maintain IC chips at appropriate operating temperatures.

SUMMARY

The present disclosure relates to a bellows assembly that can be used for pressure regulation and that allows for gas expansion in two-phase immersion cooling systems, and in some instances in single-phase immersion cooling systems. The bellows assembly includes a container having at least one flexible, polymeric wall that can deform outward from a center of the bellows and deform inward to change an amount of volume enclosed by the container. Hardware elements (such as mounting hardware, pressure-relief vent(s), and/or port(s)) can be mounted on the container. The bellows pressure-relief vent(s) can be arranged to reduce an amount of coolant-liquid vapor released from the container during an overpressure event.

Some implementations relate to a bellows assembly for a two-phase immersion cooling system. The bellows assembly can include: a container comprising a polymer and enclosing a volume, the container having a first surface spanning a first surface area that encloses the volume, wherein at least a portion of the container is reversibly deformable to increase and decrease an amount of the volume enclosed by the container; a first wall comprising the polymer and having a second surface spanning a second surface area; a second wall having a third surface spanning a third surface area, the second wall separated from the first wall by at least a portion of the volume and oriented approximately parallel to the first wall when the volume is not under pressure or vacuum, wherein the second surface area and the third surface area comprise a majority of the first surface area; a third wall extending between and connected to the first wall and the second wall; at least one port in the third wall to admit gas into the volume and expel the gas from the volume; and at least one hardware element attached to at least one of the first wall, the second wall, and the third wall to mount the container in an orientation such that at least one of the first wall and the second wall deforms or deform outward from a center of the container without external hinderance when the volume is under pressure and deforms or deform inward without external hinderance when the volume is under vacuum.

Some implementations relate to a method of regulating pressure in a two-phase immersion cooling system. The method can include acts of: receiving gas through a port and into a volume enclosed by a container of a bellows assembly in response to an increase in pressure of the gas, the container having a first surface spanning a first surface area that encloses the volume; deforming a first wall of the container in a first direction to increase the volume while receiving the gas, wherein the first wall comprises a polymer and has a second surface spanning a second surface area; expelling the gas from the volume in response to a decrease in pressure of the gas; and deforming the first wall of the container in a second direction opposite the first direction to decrease the volume while expelling the gas. The container can include a second wall having a third surface spanning a third surface area, the second wall being separated from the first wall by at least a portion of the volume and oriented approximately parallel to the first wall when the volume is not under pressure or vacuum. The second surface area and the third surface area can comprise a majority of the first surface area. The container can further include a third wall extending between and connected to the first wall and the second wall, and the bellows assembly can include at least one hardware element attached to at least one of the first wall, the second wall, and the third wall to mount the container in an orientation such that at least one of the first wall and the second wall deforms or deform outward from a center of the container without external hinderance when the volume is under pressure and deforms or deform inward without external hinderance when the volume is under vacuum.

Some implementations relate to a two-phase immersion cooling system comprising: a tank to contain one or more printed circuit boards having semiconductor dies to be cooled during operation of the semiconductor dies; coolant liquid within the tank that immerses the one or more printed circuit boards; air space within the tank above the coolant liquid; and a bellows assembly fluidically coupled to the air space and forming a normally-closed first volume that includes the air space. The bellows assembly can include: a container comprising a polymer and enclosing a second volume that is a portion of the first volume, the container having a first surface spanning a first surface area that encloses the second volume, wherein at least a portion of the container is reversibly deformable to increase and decrease an amount of the second volume enclosed by the container; a first wall comprising the polymer and having a second surface spanning a second surface area; a second wall having a third surface spanning a third surface area, the second wall separated from the first wall by at least a portion of the second volume and oriented approximately parallel to the first wall when the first volume is not under pressure or vacuum, wherein the second surface area and the third surface area comprise a majority of the first surface area; a third wall extending between and connected to the first wall and the second wall; at least one port in the third wall to admit gas into the second volume from the air space when the first volume is under pressure and expel the gas from the second volume into the air space when the first volume is under vacuum; and at least one hardware element attached to at least one of the first wall, the second wall, and the third wall to mount the container in an orientation such that at least one of the first wall and the second wall deforms or deform outward from a center of the container without external hinderance when the first volume is under pressure and deforms or deform inward without external hinderance when the first volume is under vacuum.

Some implementations relate to a method of cooling semiconductor dies in a tank of a two-phase immersion cooling system. The method can include acts of: receiving heat from the semiconductor dies into a coolant liquid within the tank, the coolant liquid filling a portion of the tank below an air space occupying a top region of the tank; receiving gas from the air space into a volume enclosed by a container of a bellows assembly in response to an increase in pressure of the gas, wherein the bellows assembly includes a port fluidically coupled to the air space and the container has a first surface spanning a first surface area that encloses the volume; deforming a first wall of the container in a first direction to increase the volume while receiving the gas, wherein the first wall comprises a polymer and has a second surface spanning a second surface area; expelling the gas from the volume in response to a decrease in pressure of the gas; and deforming the first wall of the container in a second direction opposite the first direction to decrease the volume while expelling the gas. The container can include a second wall having a third surface spanning a third surface area, the second wall being separated from the first wall by at least a portion of the volume and oriented approximately parallel to the first wall when the volume is not under pressure or vacuum. The second surface area and the third surface area can comprise a majority of the first surface area. The container can further include a third wall extending between and connected to the first wall and the second wall, and the bellows assembly can further include at least one hardware element attached to at least one of the first wall, the second wall, and the third wall to mount the container in an orientation such that at least one of the first wall and the second wall deforms or deform outward from a center of the container without external hinderance when the volume is under pressure and deforms or deform inward without external hinderance when the volume is under vacuum.

All combinations of the foregoing concepts and additional concepts discussed in greater detail below (provided such concepts are not mutually inconsistent) are part of the inventive subject matter disclosed herein. In particular, all combinations of subject matter appearing in this disclosure are part of the inventive subject matter disclosed herein. The terminology used herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally and/or structurally similar elements).

DETAILED DESCRIPTION

Figure 1:
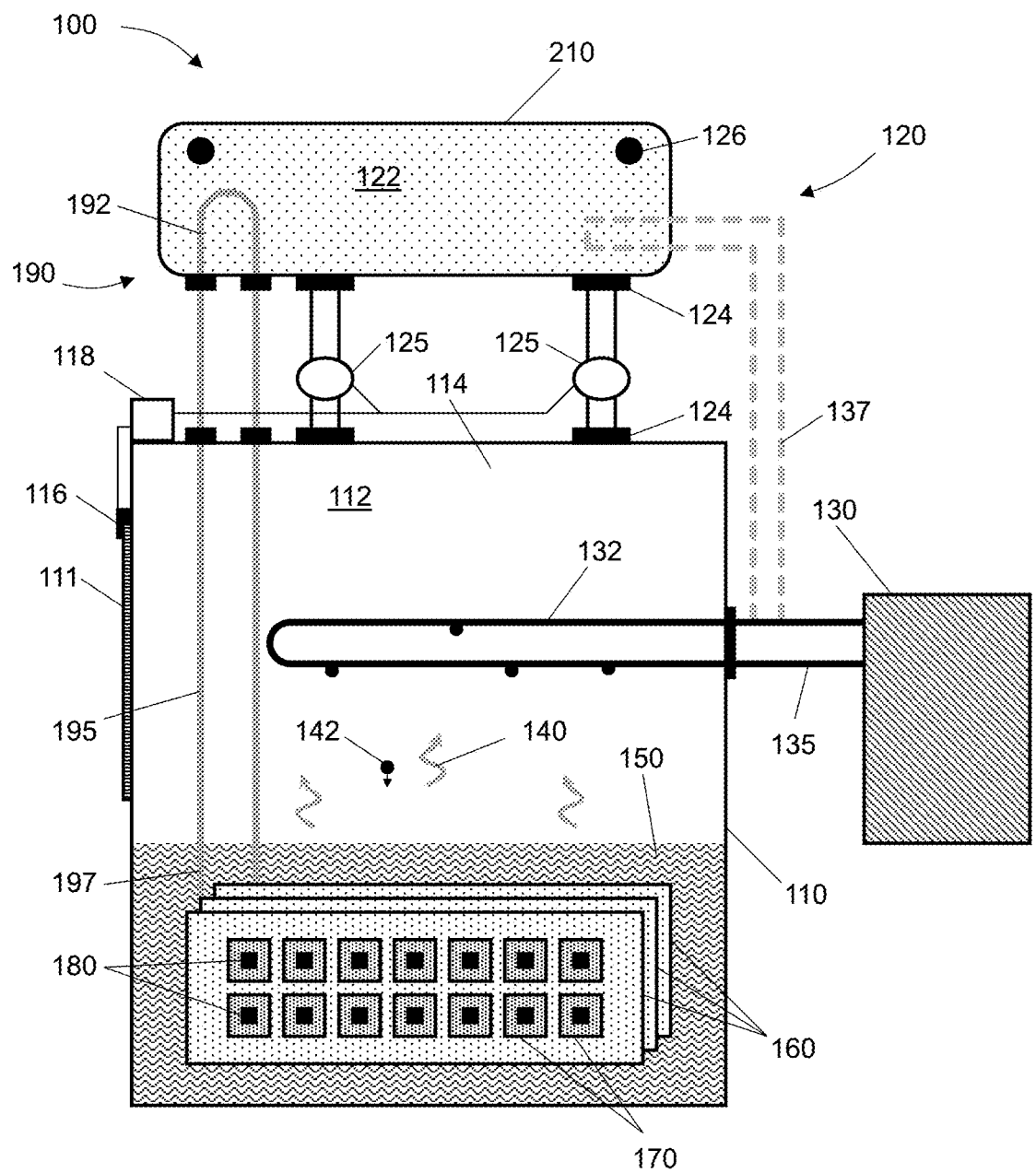
FIG. 1 depicts a two-phase immersion-cooling system to remove heat from semiconductor dies during operation of the semiconductor dies.

FIG. 1 depicts a two-phase immersion-cooling system 100 that can remove heat from semiconductor dies 180 during operation of the semiconductor dies. The immersion-cooling system 100 includes a tank 110 containing a coolant liquid 150 that fills a first portion of the tank's enclosed volume 112. Above the coolant liquid 150 is an air space 114 (also referred to as a "head space") filling a second portion of the tank's volume 112. A condenser coil 132 can be located in the air space 114 to condense coolant-liquid vapor 140 rising from the coolant liquid 150. The condenser coil 132 can carry a coolant that is circulated through the condenser coil 132 by a chiller 130.

A bellows assembly 120 can be fluidically coupled to the air space 114 of the tank 110. Gas from the air space 114 can be received into a bellows volume 122 enclosed by the bellows assembly 120 when pressure of the gas in the air space 114 increases. Additionally, gas can be expelled from the volume 122 and returned to the air space 114 when pressure of the gas in the air space 114 decreases. The tank 110 and bellows assembly 120 are coupled by at least one port 124 in a way to form a normally-closed system for gas within the air space 114 and bellows volume 122.

In some implementations, one or move isolation valves 125 can be located between the tank 110 and the bellows assembly 120, such that the bellows volume 122 can be valved off and isolated from the air space 114 in the tank.

However, in some implementations, isolation valve(s) 125 may not be included in the system. The valve(s) can be manual valves or automated valves. The tank 110 can include an access door 111, which may be located on a top or side of the tank. The access door 111 can be used to install, swap, and/or remove circuit boards (PCBs) 160 within the tank 110. In some cases, the PCBs can be hot-swapped (exchanged while the system is in operation and other PCBs 160 are running and being cooled). A PCB 160 to be exchanged can be shut down and removed through the access door 111. The access door 111 can slide open rather than swing open to reduce turbulence in the air space 114 that would eject vapor from the tank 110. Because the air space 114 and bellow volume 122 can be under pressure when the system is operating, it can be beneficial to valve off the bellows volume 122 before opening the access door 111. Isolating the bellows volume 122 with the isolation valve(s) 125 can prevent pressure and/or the heavier coolant liquid vapor from entering the air space 114 when the access door is opened and forcing coolant liquid vapor out of the tank 110.

The closing and opening of isolation valve(s) 125 can be manual in some implementations. In other implementations, a sensor 116 can be included in the immersion-cooling system 100 to detect when the access the access door 111 is being opened. For example, the sensor may detect motion or an unlocking of the access door 111. A signal from the sensor 116 can be received and processed by a controller 118, which can issue a command signal that causes the isolation valve(s) 125 to close. For example, the isolation valve(s) 125 can be driven by electromagnetic actuator(s) that are activated in response to the command signal. The controller 118 can be programmed to further issue a command signal to open the isolation valve(s) 125 in response to receiving a signal from the sensor 116 indicating that the access door 111 is closed.

The immersion-cooling system 100 can include one or more pressure-release valves 126 to release gas when a pressure in the air space 114 and/or bellows volume 122 exceeds a predetermined threshold (referred to as an overpressure event). The bellows volume 122 acts as a secondary containment unit that assists in the normal operation of the two-phase immersion cooling system 100 and also accommodates a significant portion if not all of the volume of air, air/vapor mixture in the tank's air space 114 with an intention to avoid or significantly reduce the loss of coolant-liquid vapor 140 from the immersion-cooling system 100 during an overpressure event, as described in fur5ther detail below. The immersion-cooling system 100 may or may not further include a bellows heater 190, depicted as a heating coil 192 in the illustration of FIG. 1.

There can be a plurality of semiconductor dies 180 mounted on one or more printed circuit boards 160 that are immersed in the coolant liquid 150. There can be one or more types of semiconductor dies, such as but not limited to, a microprocessor (e.g., a central processing unit (CPU) and/or graphic processing unit (GPU)), a digital signal processing (DSP) die, an application-specific integrated circuit (ASIC), field-programmable gate array (FPGA), and/or other densely patterned semiconductor die. One or more semiconductor dies 180 can be mounted in an electronic device package 170 that mounts to the PCB 160. The device package 170 can include a heat-dissipative element thermally coupled to the semiconductor dies 180 to dissipate heat from the semiconductor dies 180 into the coolant liquid 150. Examples of such heat-dissipative elements are described in U.S. provisional application Ser. No. 63/489, 895 filed on Mar. 13, 2023, titled "Electronic Package Construction for Immersion Cooling of Integrated Circuits," which application is incorporated herein by reference in its entirety. The heat-dissipative element can thermally couple to the semiconductor die 180 with or without a protective lid over the semiconductor die.

In the two-phase immersion-cooling system 100, heat flows from the semiconductor dies 180, where the heat is generated during operation of the semiconductor dies, into the heat-dissipative element which is in physical and thermal contact with the coolant liquid 150. The amount of heat delivered to the coolant liquid 150 is enough to boil the coolant liquid. The heating and boiling of the coolant liquid 150 produces the coolant-liquid vapor 140 that rises to the condenser coil 132. The coolant-liquid vapor 140 can be cooled and condensed back to liquid droplets 142 by the condenser coil 132. The liquid droplets 142 from the condensed vapor 140 can drip and/or flow back to the coolant liquid 150.

Figure 2A:
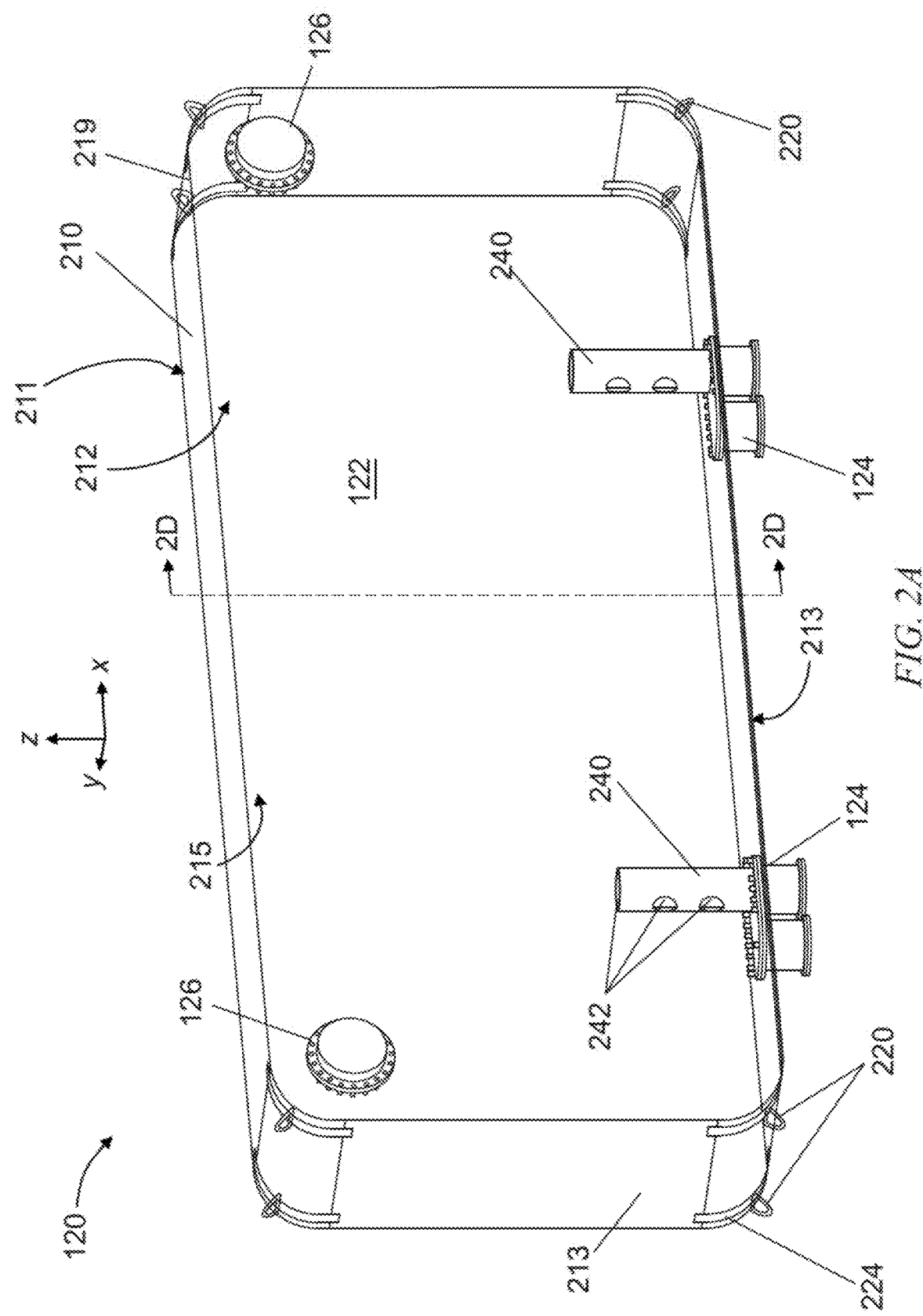
FIG. 2A illustrates, with a semi-transparent perspective view, an example of a bellows assembly that can be used with the immersion cooling system of FIG. 1.

FIG. 2A illustrates an example of the bellows assembly 120 in further detail. The bellows assembly 120 can be used with the two-phase immersion-cooling system of FIG. 1. In some implementations, the bellows assembly 120 can be used with single-phase immersion-cooling systems (e.g., when coolant liquids based on fluorochemistry are used as the immersion coolant). A perspective view of the bellows assembly is illustrated with partial transparency to reveal features inside the assembly. The bellows assembly comprises a container 210 that can be formed, at least in part, from polymer (e.g., polyurethane, mylar, polyethylene, silicone, etc.) The container 210 has an interior surface 215 spanning a surface area that encloses the volume 122 within the container 210. The container can have a rectangular shape, as depicted, or may have another shape (e.g., square, disc, oval, polygonal). At least a portion of the container 210 is reversibly deformable to increase and decrease an amount of the volume 122 enclosed by the container 210 when pressure inside the container changes.

There can be one or more mounting hardware elements 220 attached to the container 210 to securely mount the bellows assembly 120 in a desired orientation (e.g., vertical as depicted, horizontal, or in any other orientation). A vertical orientation is one in which a deformable wall of the container having a largest area among the container walls (e.g., first wall 211 or second wall 212) is standing on edge, oriented perpendicular to the Earth's ground or floor on which the immersion-cooling system rests. The mounting hardware elements 220 can be located to reduce their interference with deforming walls of the container 210. For example, the mounting hardware elements 220 can be located at or near corners of the container 210 and/or at or near edges of the container walls 211, 212, 213.

The illustration of FIG. 2A shows D-rings for the mounting hardware elements 220 that are located at or near eight rounded corners of the container 210. Although FIG. 2A depicts eight mounting hardware elements 220 for the container 210, there can be from one to twenty mounting hardware elements 220 or even more arranged on the container 210 to support the bellows assembly 120. The mounting hardware elements 220 can couple to external structure to stabilize the bellows assembly 120 adjacent to the tank 110 (e.g., over or beside the tank). In some implementations, described further below, there may be no mounting hardware elements 220 attached to or integrally formed with the container 210.

Figure 2B:
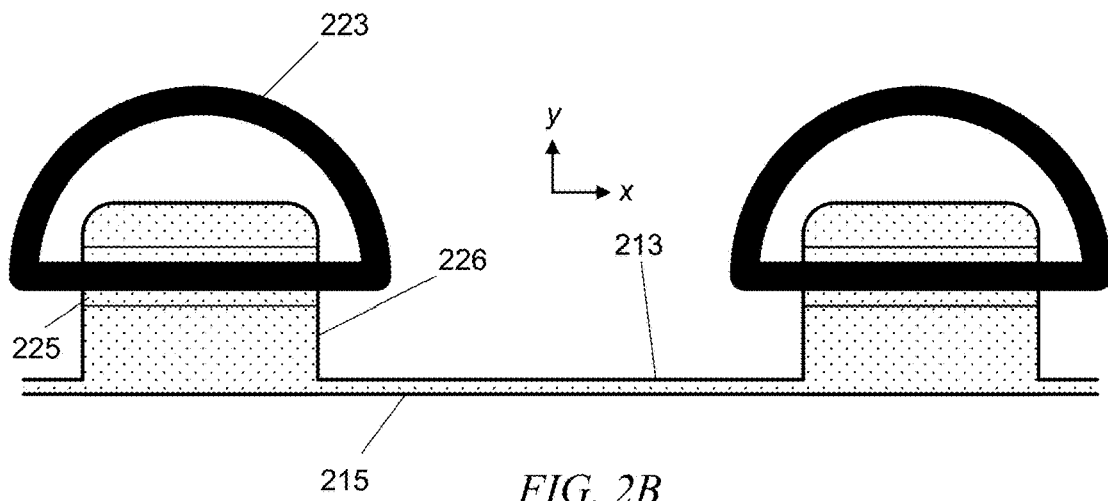
FIG. 2B depicts an enlarged view (in cross-section) of one example of mounting hardware elements that can be included in the bellows assembly of FIG. 2A.

The mounting hardware elements 220 can be metallic or formed from a polymer. In some implementations, each mounting hardware element 220 can be attached to the container 210 (e.g., with a strap 224, tape, or adhesive). In some cases, each mounting hardware element 220 can attach to a feature on the container, such as a ridge or tab 226 that is integrally formed on an exterior surface of a wall 211, 212, 213 or along edges of the container 210. For example, an O-ring or D-ring 223 can pass through a hole 225 in the ridge or tab 226 that is integrally formed on an exterior surface of a wall 213, as depicted in FIG. 2B.

Figure 2C:
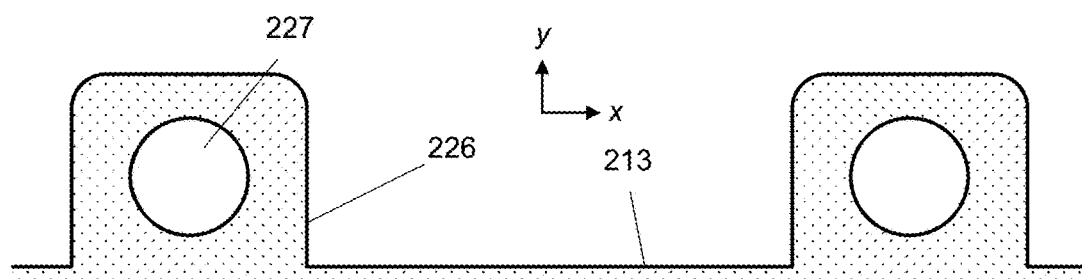
FIG. 2C depicts an additional example of mounting hardware elements that can be included in the bellows assembly of FIG. 2A.

In some implementations, each mounting hardware element 220 can be integrally formed on an exterior wall 213 of the container 210. For example, the mounting hardware element 220 can be an integrally formed ridge or tab 226, as depicted in FIG. 2C, that includes a hole 227 therethrough to allowing mounting of the container (via a screw, bolt, pin or other fastener) to an exterior structure. The hole 227 can be oriented vertically, as depicted in FIG. 2C, or horizontally, as depicted by the hole 225 in FIG. 2B.

Inside the container 210 can be one or more venting conduits 240 (e.g., tubes) that fluidically couple to the port(s) 124. The venting conduit(s) can allow for ingress and egress of gas into and out of the bellows volume 122. The venting conduits 240 can include one or more vent holes 242 located to avoid being plugged by collapsing walls of the container 210. For example, the vent holes 242 are arranged such that gas exiting the vent holes 242 into the bellows volume 122 flows in a direction that is approximately parallel to (within 20 degrees), or not normal to, at least one deformable wall, such as the first wall 211 (occluded in the drawing) and second wall 212 of the container 210.

For the implementation of FIG. 2A, each port 124 comprises a double flange assembly, which can reduce gas flow impedance and/or provide additional support for the container 210 and/or venting conduits 240 within the container. However, a single flange assembly can be used in some cases, an example of which is described further below in connection with FIG. 3A.

Figures 2D, 2E, 2F:
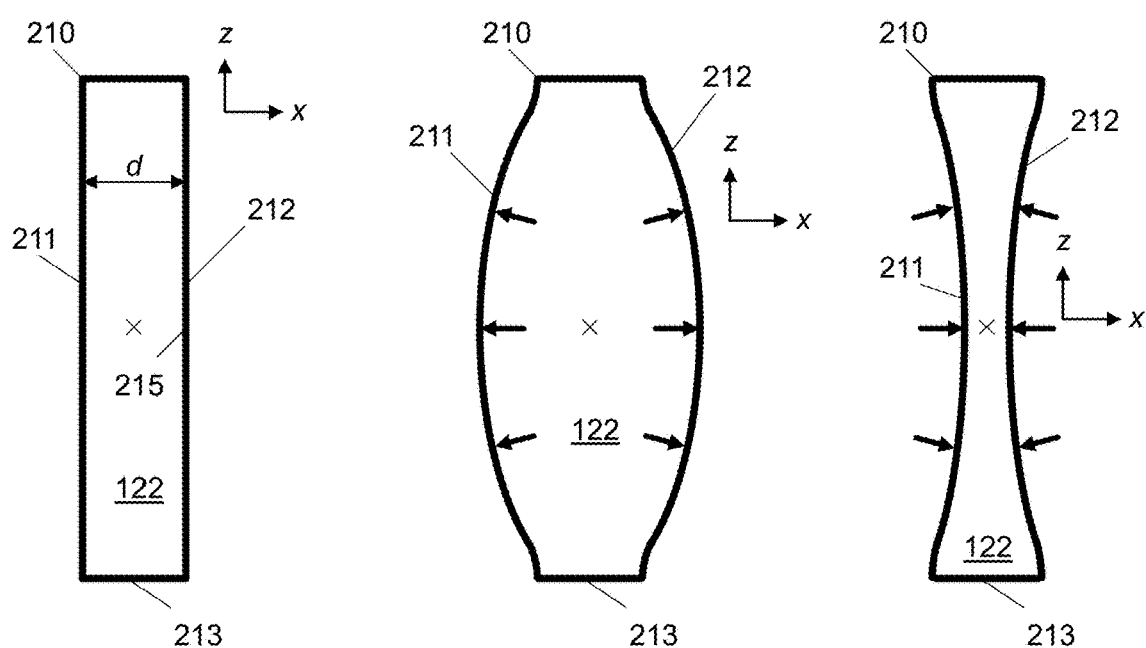
FIG. 2D depicts a cross-section of the container, taken at the location indicated by the dashed line in FIG. 2A.
FIG. 2E depicts deformation of walls of the container of FIG. 2A when the pressure of gas within the container increases.
FIG. 2F depicts deformation of walls of the container of FIG. 2A when the pressure of gas within the container decreases.

The container 210 can include at least the first wall 211, second wall 212, and third wall 213 that enclose at least a portion of the bellows volume 122, as depicted in FIG. 2D. In an ambient environment, when there is no pressure differential across the walls of the container 210, the first wall 211 and second wall 212 can be approximately parallel to each other (i.e., within 20 degrees of being parallel to each other, including being exactly parallel). The first wall 211 can span a first surface area and the second wall 212 can span a second surface area, which may be a same amount as or different amount than the first surface area. The first surface area and the second surface area can form a majority of the interior surface 215 of the container 210 that encloses the volume 122. The first wall 211 can be separated from the second wall 212 by a space occupied by at least a portion of the volume 122. The separation distance d between the first wall 211 and second wall 212 can be from 5 millimeters (mm) to 500 mm, though smaller or larger distances can be used. In some cases, the separation distance d can be from 100 mm to 500 mm. The third wall 213 can connect to the first wall 211 and connect to the second wall 212 and can extend part way or all the way around a periphery of the container 210. In FIG. 2A the third wall 213 extends all the way around the container 210. In other implementations, the container can have six distinct walls (e.g., front, back, top, bottom, left side, right side).

At least one of the first wall 211, second wall 212, and third wall 213 comprises (or comprise) a flexible polymer that allows the wall(s) to deform when the pressure of gas within the volume 122 changes. The thickness of the flexible polymer can be from 0.1 mm to 3 mm, though thinner or thicker polymer may be used in some cases. In some cases, the thickness of the flexible polymer can be from 0.5 mm to 2.5 mm. The first wall 211 and second wall 212 can have a same rectangular shape, as depicted in FIG. 2A, or may have another shape (e.g., square, disc, oval, polygonal). The first wall 211 and second wall 212 each can span an area (in x and y directions in FIG. 2A) from 0.2 square meter ($m^2$) to 3 $m^2$, though larger walls may be used for the container 210. In some cases, the first wall 211 and second wall 212 each can span an area from 0.5 $m^2$ to 3 $m^2$. The volume 122 within the container 210 can occupy from 0.05 cubic meter ($m^3$) to 3 $m^3$, though larger volumes may be used in some cases. In some implementations, the volume 122 can occupy from 0.5 $m^3$ to 2 $m^3$.

FIG. 2E and FIG. 2F depict an implementation where the first wall 211 and the second wall 212 comprise a flexible polymer, whereas the third wall 213 is comparatively stiffer. For example, the third wall 213 can be thicker and/or formed from a different material than the thickness of and/or material used to form the first wall 211 and the second wall 212. Under positive pressure (depicted in FIG. 2E), gas within the volume 122 pushes the first wall 211 and second wall 212 outward, away from the center of the container 210 (marked by the x symbol in the drawing). This increases the bellows volume 122 to accommodate more gas from the tank 110. Under negative pressure or vacuum (depicted in FIG. 2F), ambient air outside the volume 122 pushes the first wall 211 and second wall 212 inward, toward the center of the container 210. This decreases the bellows volume 122, returning gas to the tank 110.

Although FIG. 2E and FIG. 2F depict an implementation where two walls comprise flexible polymer and can deform, in another implementation only one wall (e.g., the first wall 211) can comprise a flexible polymer and deform according to changes in pressure of the gas within the bellows volume 122. In such implementations, at least one of the walls 211, 212, 213 can differ from at least one other wall of the container 210. For example, one or more walls 211, 212, 213 may differ in material composition and/or thickness such that one wall is comparatively stiff, and flexes insignificantly compared to another wall of the container 210. When the container 210 includes a stiff wall or walls, the ports 124, pressure-release valve 126, and/or mounting hardware elements 220 can be attached to the stiff wall or walls. Further, a heating element and/or insulating enclosure (described in more detail below) can be attached to and/or supported by the stiff wall or walls. In another implementation, the first wall 211, second wall 212, and third wall 213 can all comprises a flexible polymer and deform according to changes in pressure of the gas within the bellows volume 122.

According to some implementations, the bellows assembly 120 is mounted with the mounting hardware elements 220 such that the container 210 is in a vertical orientation, as depicted in FIG. 1 and FIG. 2A. In a vertical orientation, the wall(s) 211, 212 of the container 210 that undergo the most deformation due to changes in pressure of gas within the bellows volume 122 can move horizontally and without hindrance by any external structure. The horizontal direction would be parallel to a floor on which the immersion-cooling system 100 rests. In such an orientation, two or more bellows assemblies 120 could be mounted end-to-end, side-by-side (with appropriate spacing therebetween), and/or above and below each other to service one tank 110.

Other mounting orientations are possible, including horizontal. The container 210 may be mounted horizontally using the same or different mounting hardware elements. In a horizontal orientation, the wall(s) 211, 212 of the container 210 that undergo the most deformation due to changes in pressure of gas within the bellows volume 122 can move vertically and without hindrance by any external structure. In a horizontal orientation, two or more bellows assemblies 120 could be mounted above and below each other to service one tank 110.

Referring again to FIG. 1, changes in pressure of gas within the bellows volume 122 can be caused by changes in operation of the semiconductor dies 180 within the tank 110 of the immersion-cooling system 100. For example, when all semiconductor dies 180 in the tank 110 are operating at full capacity, they will generate a significant amount of heat that causes the most amount of boiling of the coolant liquid 150. This boiling at peak operation produces the most amount of coolant-liquid vapor 140 from the coolant liquid 150 that goes into the air space 114, heating air in the air space and increasing pressure in the air space. The increased pressure of the gas within the air space 114 forces gas from the air space 114 into the bellows volume 122 via at least one port 124 and expands the container 210, as depicted in FIG. 2E. If an over-pressure event occurs during peak operation, gas can be vented from the system (as described further below). When operation of the semiconductor dies 180 decreases such that only one or a few semiconductor dies are operating at low capacity, the coolant liquid 150 can cool and the amount of coolant-liquid vapor 140 in the air space 114 can decrease, creating a comparative vacuum or negative pressure condition in the air space 114 with respect to the bellows volume 122. This negative pressure condition in the air space 114 allows the container 210 to expel gas from the bellows volume 122, through the port(s) 124, and back into the air space 114. In some cases, the negative pressure in the air space can pull gas from the bellows volume 122, causing the container to deform inward as depicted in FIG. 2F.

When gas pressure within the air space 114 and/or bellows volume 122 exceeds a predetermined pressure threshold, it can be vented through a pressure-release valve 126. High pressure within the air space 114 can be undesirable because it can change the boiling temperature of the coolant liquid 150. Accordingly, the pressure threshold for release of gas may be a small amount above the ambient pressure (e.g., from 0.2 psi to 3 psi above the ambient pressure around the immersion-cooling system 100), though a higher pressure-release threshold can be used in some implementations. When pressure exceeds the pressure threshold value, the pressure-release valve 126 can open to release gas from the system. According to some implementations, the container 210 is configured to controllably rupture (rather than explode) at a second pressure threshold that is higher than the pressure-release threshold. For example, a seam or groove formed in the container 210 can be configured to tear at a second pressure threshold that is from 2 psi to 10 psi higher than the pressure release threshold. The controlled rupture can occur if a pressure-release valve sticks, for example.

The inventors have recognized and appreciated that some coolant liquids 150 are expensive and that venting coolant-liquid vapor 140 into an ambient environment can incur a significant operating expense for the immersion-cooling system 100. Accordingly, the pressure-release valve 126 can be located in the system 100 to reduce an amount of coolant-liquid vapor 140 released during an over-pressure event. Since the coolant-liquid vapor 140 can be heavier than air and heavier than water vapor, the pressure-release valve 126 can be located at a high elevation in the immersion-cooling system 100. At a higher elevation, the partial pressure and content of coolant-liquid vapor 140 can be lower than the partial pressure and content of the coolant-liquid vapor 140 at a lower elevation, near the coolant liquid 150, in the system. For example, the coolant-liquid vapor 140 can be comparatively denser than air so that the air molecules (oxygen, nitrogen) in the tank 110 are relatively lighter. The difference in densities between air and coolant-liquid vapor 140 will cause the air molecules to rise upwards and the coolant-liquid vapor 140 to stay relatively lower. Therefore, when the air is pushed upwards by the coolant-liquid vapor 140 from the coolant liquid 150 in the tank 110, air will move up from the air space 114 in the tank 110 to the container 210. Instead of mounting a pressure-release valve 126 directly to the tank 110, the pressure-release valve 126 can be located above the tank 110 (e.g., on an extension pipe the extends vertically above the tank and/or bellows assembly 120, or high on the container 210 of the bellows assembly 120).

For implementations like that depicted in FIG. 1, the bellows assembly 120 is located vertically above the tank 110 and the pressure-release valve(s) 126 can be located at or near a top edge of the container 210. For example, the pressure-release valve(s) 126 can be located within 10 centimeters (cm) of an edge 219 of a wall of the container 210, or even withing 5 cm of an edge 219 of a wall of the container 210, where the edge is a top edge of the container 210 when the bellows assembly 120 is mounted to service the tank 110 during operation of the immersion-cooling system 100. In some implementations, the pressure-release valve(s) 126 can be located on a top, upward facing wall of the container 210. When a pressure-release valve 126 mounted high in the system opens during an over-pressure event, it can vent proportionately more air and/or water vapor and less coolant-liquid vapor 140 from the system than the valve would vent if located at a lower elevation in the system (e.g., in the tank 110 closer to the coolant liquid 150 or near the bottom of the bellows assembly 120).

The bellows assembly 120 can include one or more ports 124 to admit gas into the bellows volume 122 from the air space 114 in the tank 110 and to expel gas from the bellows volume 122 back to the air space 114. The port(s) can include hardware elements that attach to the container 210 of the bellows assembly 120. A port 124 may also be used to attach each pressure-release valve 126 and or a sensor to the container 210.

Figure 3A:
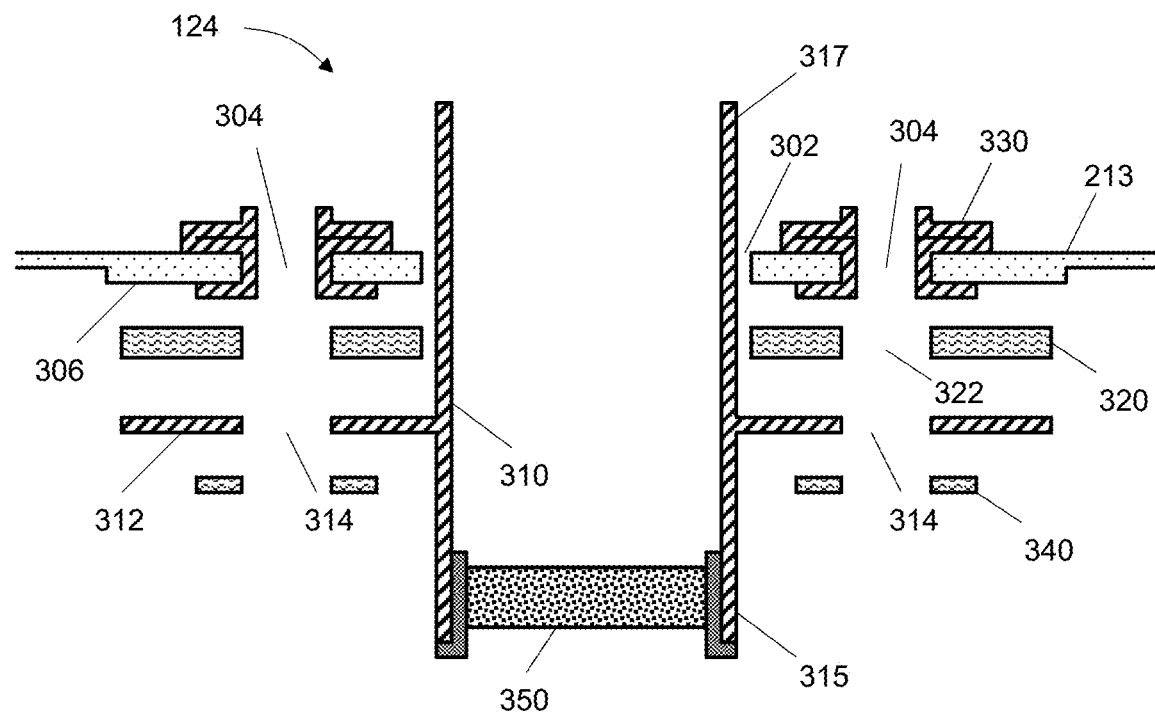
FIG. 3A depicts an example of port components and a vapor barrier that can be used with the bellows assembly of FIG. 2A.

FIG. 3A depicts, in cross-section and partial exploded view, one example of a port 124 that can attach to the container 210. The port 124 can include a port insert 310 that includes a flange 312 having a plurality of flange holes 314 through the flange 312. The flange holes 314 can be distributed around the flange 312. The port insert 310 can include at least one exterior conduit 315 that fluidically couples to at least one interior conduit 317. The interior conduit 317 can be arranged to pass through the container wall 213 and extend into the interior of the container 210 when the port insert 310 is mounted to a wall (e.g., the third wall 213) of the container 210. In some cases, the interior conduit 317 fluidically couples to the venting conduit 240 or is configured to be the venting conduit 240 (e.g., by having at least one hole to vent gas as described above for the venting conduit 240 of FIG. 2A. In some implementations, the flange 312 can be welded or otherwise adhered to a conduit to make the port insert 310. One or both of the interior conduit 317 and exterior conduit 315 can have a smooth outer surface (as shown) or may have a barbed outer surface for attaching a flexible hose or a tube.

A region of the container wall 213 where the port 124 mounts can include an entry hole 302 to receive the port insert 310 and may or may not include a ring 306 of increased wall thickness surrounding the entry hole 302. There can be a plurality of container screw holes 304 in the container wall 213 surrounding the entry hole 302 and having a pattern that matches the pattern of the plurality of flange holes 314 in the flange 312. Threaded rivet inserts 330 can be placed in the holes 304 through the container wall 213 and tightened to engage the riveting action and provide threaded nuts secured to the container 210.

To seal the port insert 310, exterior conduit 315, and interior conduit 317 to the container 210, a gasket 320 can be located between the flange 312 and the container wall 213. In some cases, the gasket 320 can be formed from a soft material (e.g., silicone or a closed-cell foam). Additionally or alternatively, the gasket 320 can be formed in place (e.g., by applying silicone or another sealant on the flange 312 and/or container wall 213 where the flange 312 mates to the wall 213). The gasket 320 can include a plurality of holes 322 that align with screw holes 304 in the container and with the plurality of flange holes 314. Machine screws (not shown) can then be inserted through the flange holes 314, through the gasket 320, and into the threaded rivet inserts 330. The machine screws can be tightened to seal the port insert 310 to the container. Flexible washers 340 may or may not be used to as an additional seal around each flange hole 314 (e.g., to prevent gas from escaping through the threads of the machine screws).

Once sealed to the container 210, a conduit (e.g., a tube or hose) can be attached to the exterior conduit 315 of the port insert 310. The conduit can also connect at a distal end to a port 124 on the tank 110 to fluidically couple the volume 122 of the container 210 to the air space 114 in the tank 110. In some cases, a flexible hose can slide over the exterior conduit 315 and be secured with a hose clamp. In some cases, the exterior conduit 315 can include hose barbs and a flexible hose can be pushed over the barbs to secure the hose. In some implementations, a tube having an inner diameter large enough to slide over the exterior conduit 315 (or outer diameter small enough to fit inside the exterior conduit 315) can be adhered to the exterior conduit 315 with an adhesive and/or crimped onto the exterior conduit.

Figure 3B:
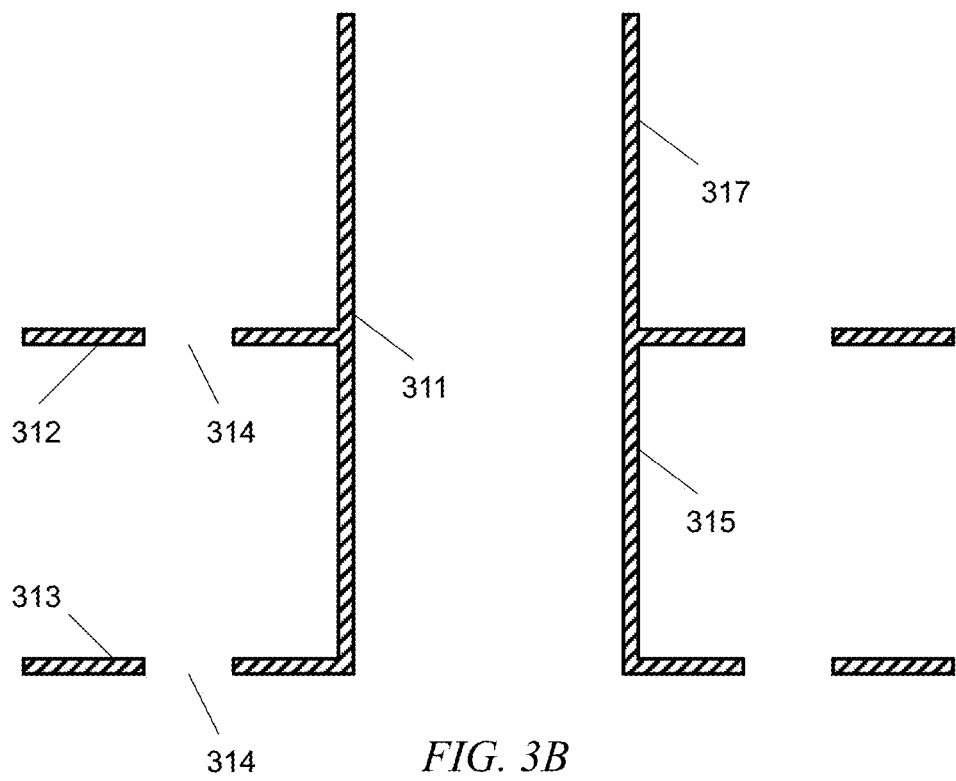
FIG. 3B illustrates an example of a port insert that can be used in the assembly of FIG. 3A.

FIG. 3B depicts another implementation of a port insert 311 that may be used alternatively in the port assembly of FIG. 3A. In this implementation, the port insert 311 includes a first flange 312 and a second flange 313. Both flanges can include a plurality of flange holes, which may be arranged in the same or different patterns around the exterior conduit 315. The first flange 312 can be used to attach the port insert 310 to the container 210 of a bellows assembly 120. The second flange 313 can attach with machine screws and a gasket to a mating flange on the tank 110 of the immersion-cooling system 100, for example.

Because the port inserts 310, 311 can be made from a rigid material (e.g., a metal or stiff polymer), they can provide mechanical support to the container 210 of the bellows assembly 120. For example, one or more port inserts 310, 311 can rigidly couple to the tank 110 via the second flange 313 and/or exterior conduit 315 and provide adequate support for the container 210 and bellows assembly 120, as depicted in FIG. 6B. In such implementations, mounting hardware elements 220 may not be included on the container 210.

Figure 3C:
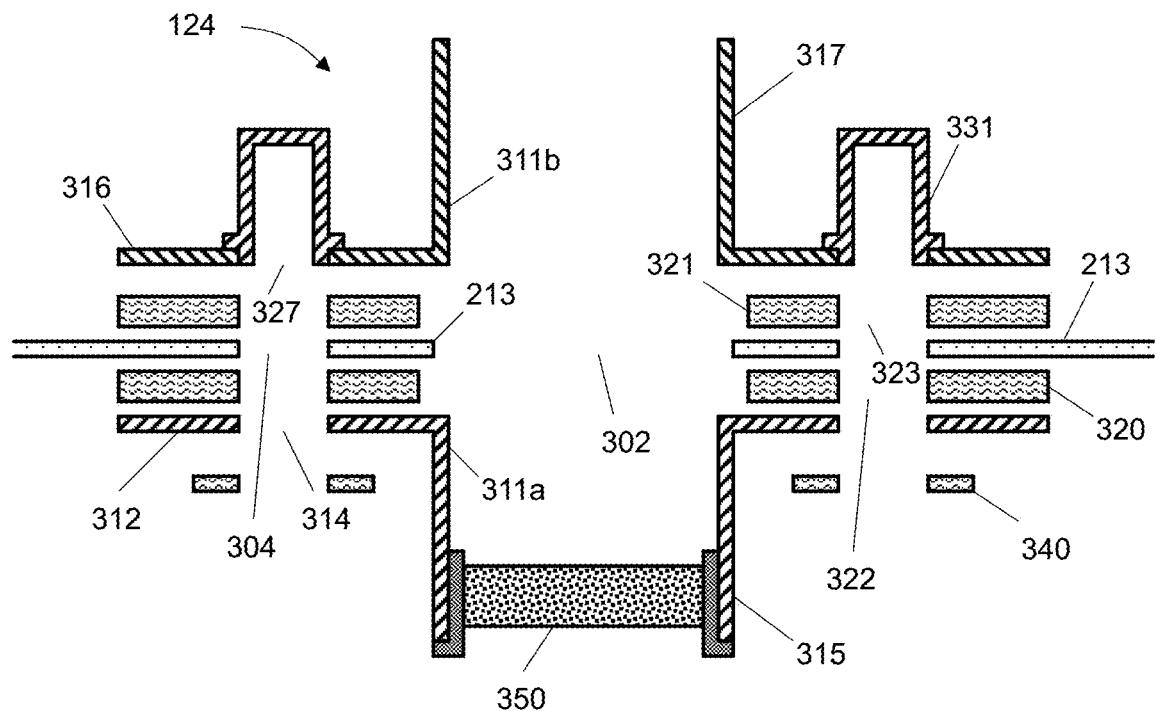
FIG. 3C depicts an additional example of port components and a vapor barrier that can be used with the bellows assembly of FIG. 2A.

FIG. 3C depicts another implementation of a port 124. In this implementation, an exterior port insert 311a and an interior port insert 311b are located outside and inside the container 210, respectively. The exterior port insert 311a comprises an exterior conduit 315 connected to a first flange 312. The interior port insert 311b comprises an interior conduit 317 connected to a second flange 316. Each flange can connect to its conduit by welding or an adhesive. The first flange 312 can include a first plurality of holes 314 and the second flange 316 can include a second plurality of holes 327 that align to each other. Threaded blind inserts 331 can be placed in the second plurality of holes 327, or the holes 327 themselves can be threaded and the blind inserts not used. Two gaskets 320, 321 with aligned holes 322, 323 can be placed on either side of the container wall 213 to seal the port inserts 311a, 311b to the container wall 213. To get the interior port insert 311b inside the container, the entry hole 302 in the container wall 213 and the flanges 316, 312 can be oval or oblong. Machine screws or bolts can be placed through the holes to engage threads in the blind inserts 331 to clamp the assembly together.

Figure 3D:
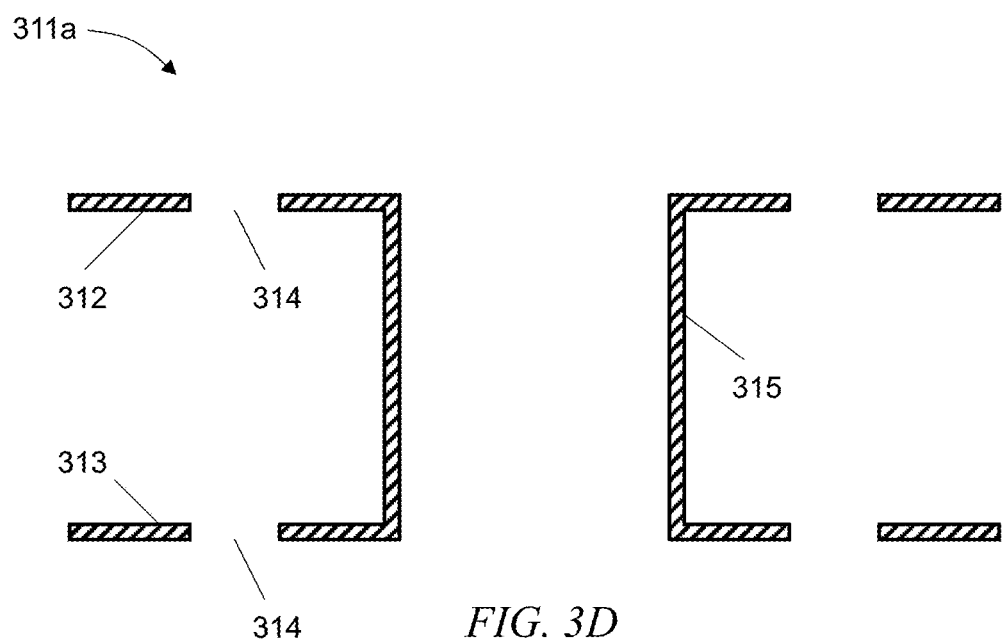
FIG. 3D illustrates an example of an exterior port insert that can be used in the assembly of FIG. 3C.

FIG. 3D depicts another implementation of an exterior port insert 311a that can be used in the port assembly of FIG. 3C. The exterior port insert 311a includes a second flange 313 to provide for coupling to another flange or device. For example, the second flange 313 could couple to a flange on the tank 110 of the immersion-cooling system 100.

Figure 3E:
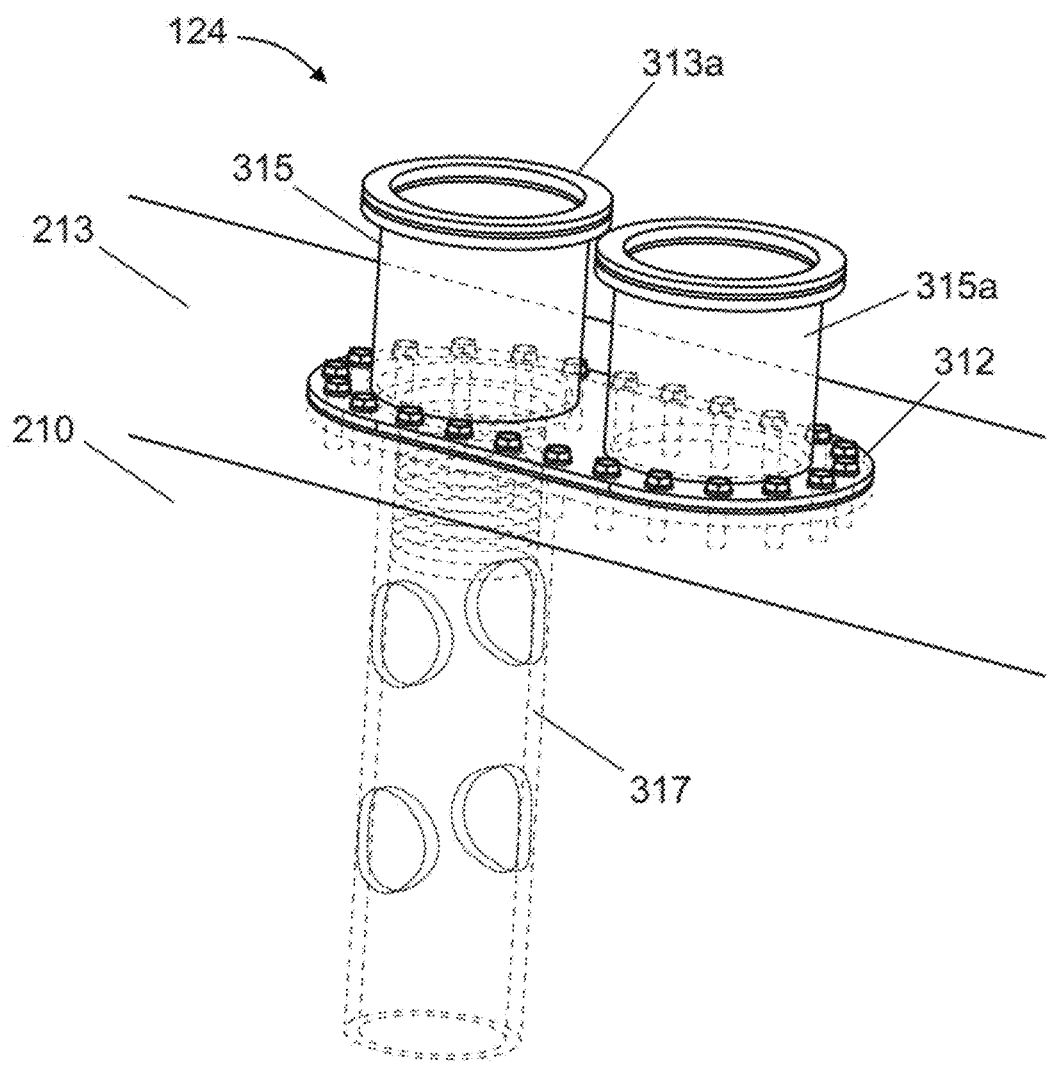
FIG. 3E illustrates an example of a port in perspective view.

FIG. 3E is an illustration of one example of a port 124 that could be used with the container 210. The port 124 includes an additional exterior conduit 315a that is connected to the flange 312. In some implementations, the second flange 313a of the exterior conduit(s) may not contain holes and may be quick-release type flanges, for example.

The port 124 can also be used to fluidically couple the pressure-release valve 126 to the container 210 of the bellows assembly 120. For example, the pressure-release valve 126 can couple to or directly mount onto the exterior conduit 315 of the port insert 310 of FIG. 3A, or the pressure-release valve 126 can couple to or directly mount onto the second flange 313 of the port insert in FIG. 3B or FIG. 3D. The pressure-release valve 126 can also couple to the exterior port insert 311a of FIG. 3C.

In some implementations, at least one vapor barrier can be used in the immersion-cooling system 100 to block the flow of the coolant-liquid vapor 140 and/or water vapor from reaching some parts of the system. FIG. 3A depicts one implementation of a vapor barrier 350 that can be mounted in a port insert 310 of a port 124. The vapor barrier 350 can comprise a membrane with micrometer-scale or nanometer-scale holes that are sized to block the flow of coolant-liquid vapor 140 and/or water vapor past the vapor barrier 350, and yet allow the flow of air molecules (e.g., oxygen and nitrogen gases) to pass through the vapor barrier. In some implementations, the vapor barrier can comprise an activated filter to capture coolant-liquid vapor 140 and/or water vapor.

One or more different or same vapor barriers 350, or a mixture of same and different vapor barriers, can be used in the immersion-cooling system 100. For example a first vapor barrier 350 can be used to block the flow of coolant-liquid vapor 140 into the bellows volume 122 and/or to block the flow of coolant-liquid vapor 140 into a pressure-release valve 126. A second vapor barrier may be located to capture water vapor passing between the air space 114 and the bellows volume 122. The vapor barrier(s) 350 (which can comprise a molecular sieve, desiccant, adsorbent, or some combination thereof) can be located in one or more places within the immersion-cooling system 100 (e.g., at ports 124 on the tank 110, at ports 124 of the bellows assembly 120 including those used to mount one or more pressure-release valves 126, and within the container 210 (e.g., partitioning the bellows volume 122 into two regions where one region contains the pressure-release valve(s) 126. The vapor barrier(s) 350 can be located to block coolant-liquid vapor 140 from entering the region contains the pressure-release valve(s) 126.

The inventors have further recognized and appreciated that condensing of coolant-liquid vapor 140 and water vapor in the bellows assembly 120 can be undesirable. For example, the coolant liquid 150 may contain a fluoroketone that can react with liquid water and create an acid. The acid may be corrosive to some components in the system. By blocking the flow of water vapor that would otherwise flow back into the tank 110 from the bellows volume 122 and/or capturing water vapor (e.g., with a desiccant in the vapor barrier 350), the creation of acid in the tank can be prevented.

Condensation of water vapor and/or coolant-liquid vapor 140 in the bellows assembly 120 can be prevented by heating the bellows assembly and/or providing heat to the gas within the container 210. One approach to providing heat to the gas within the container 210 is depicted in FIG. 1. A heater 190 comprising a heating coil 192 can carry a heat-transfer liquid (e.g., water or a mixture comprising ethylene glycol) to heat gas within the bellows volume 122. The heating coil 192 can be inside the container 210 of the bellows assembly 120 (e.g., directly heating gas within the bellows volume 122) or can be external to the container 210 (e.g., heating walls of the container 210). The heating coil 192 can be part of a closed-loop fluid circuit 195 that extends into the coolant liquid 150 within the tank 110 where heat is coupled to the heat-transfer liquid by a coil 197 immersed in the coolant liquid 150. There can be one or more fluid circuits 195 providing heat to one or more bellows assemblies 120 in an immersion-cooling system 100. Ports 124 like those described above in connection with FIG. 3A and FIG. 3B can be used to pass the fluid conduit of the heating circuit 195 through walls of the container 210 and through walls of the tank 110. The heater 190 can be passive in some cases (e.g., relying on thermally-induced flow of the heat-transfer liquid in the system) or can be active (e.g., mechanical pumping of the heat-transfer liquid and/or heated by an external active heat source instead of entering the tank 110 and being heated by the coolant liquid 150). In some cases, the heat-transfer liquid can be a phase change material (PCM) that changes into a vapor phase when heated in the tank 110 by the coolant liquid 150 or when heated by an external source.

Figure 4A:
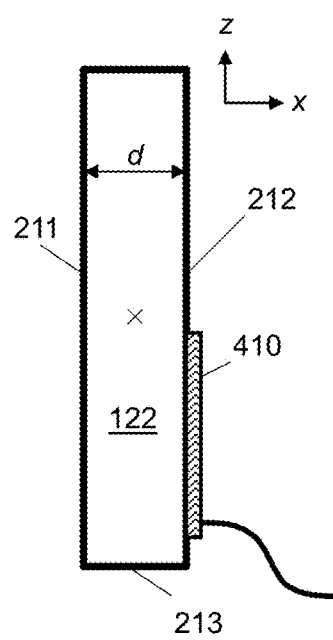
FIG. 4A depicts one arrangement of a heating element that can be used to provide heat to the bellows assembly of FIG. 2A.

Other types of heaters 190 can be used for the bellows assembly 120. FIG. 4A depicts an implementation where an electrically-resistive heating element 410 is thermally coupled to a wall 212 of the container 210. The heating element 410 can be a flexible heating pad, resistive wire, silicone heater, a heating element embedded in rubber or fiberglass, an etched foil flexible heater, polyimide heater, heating tape, Peltier, or thermoelectric heater. In some cases, the heating element 410 (such as a silicone heater) can form at least a portion of a wall of the container 210.

Figure 4B:
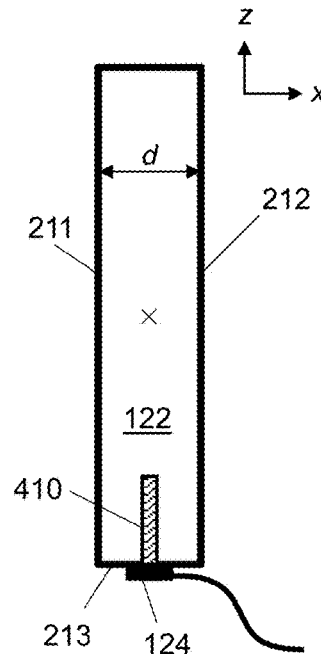
FIG. 4B depicts an additional arrangement of a heating element that can be used to provide heat to the bellows assembly of FIG. 2A.

FIG. 4B depicts another heating arrangement where the electrically-resistive heating element 410 enters into the bellows volume 122 to heat gas directly inside the container 210. The heating element 410 may connect to a port insert 310 of a port 124 described above in connection with FIG. 3A and FIG. 3B.

Another method of providing heat to the bellows assembly 120 can be similar to that shown in FIG. 1 except that the heat for the fluid circuit 195 is provided by another source instead of the coolant liquid 150. In one example, the fluid circuit 195 can be an extension of the fluid circuit 135 connected to the chiller 130. The return line from the condenser coil 132 can be extended to run to a heating coil 192 in the bellows assembly 120 before returning to the chiller 130, as depicted by the fluidic circuit extension 137 in FIG. 1 (dashed, shaded lines). Heat received from condensing coolant-liquid vapor 140 in the tank 110 can be provided to the bellows assembly 120. In another example, the fluid circuit 195 can run to the chiller 130 instead of the tank 110 and receive heat from the chiller 130 that is generated in the process of cooling liquid coolant circulated through the condenser coil 132.

Figure 5A:
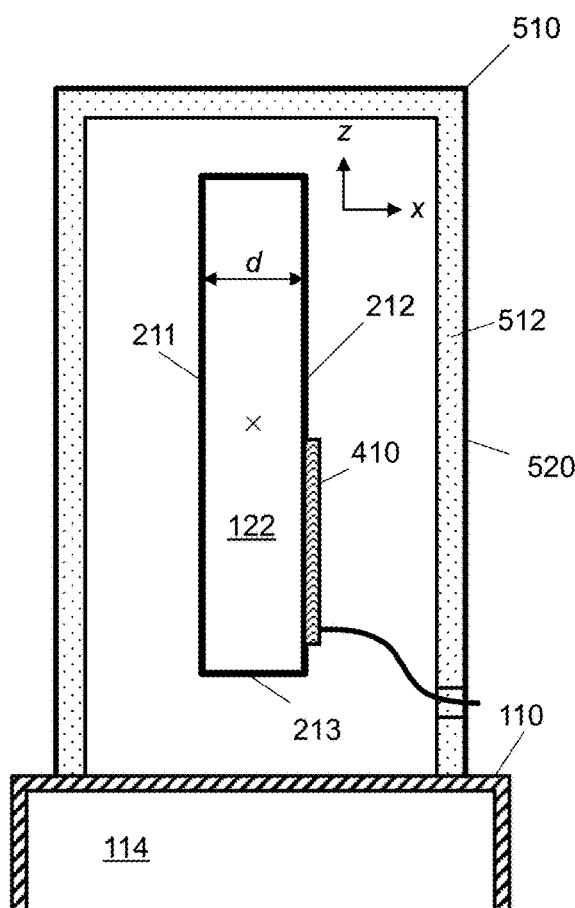
FIG. 5A illustrates an insulating enclosure that can be placed around the bellows assembly of FIG. 2A.
Figure 5B:
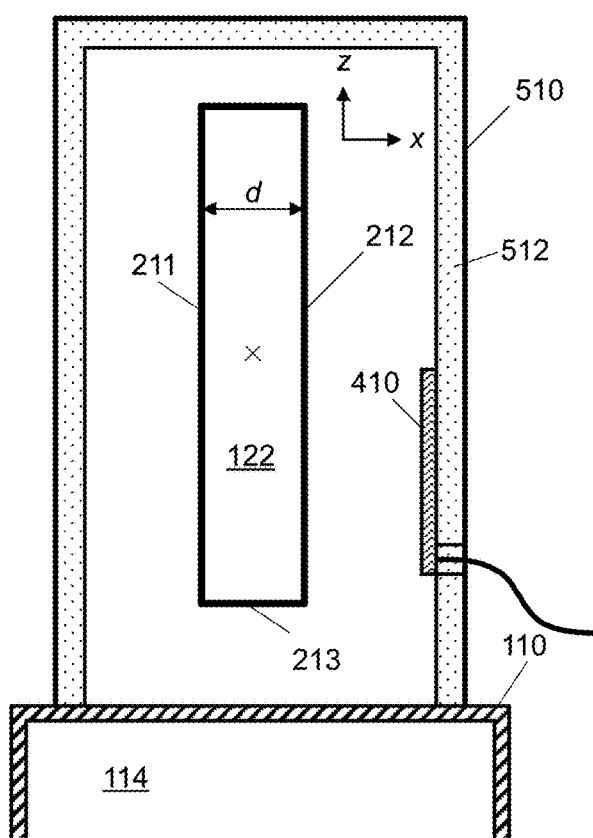
FIG. 5B illustrates an additional implementation of an insulating enclosure that can be placed around the bellows assembly of FIG. 2A.

In some implementations, a heater 190 can provide heat to an enclosure surrounding the bellows assembly 120, such as the insulated enclosure 510 depicted in FIG. 5A. The inventors have recognized and appreciated that some operating environments, such as those at data centers, can be cool and may cause condensing of water vapor and/or coolant-liquid vapor 140 in the bellows assembly 120. Accordingly, an insulated enclosure 510 can be placed around the bellows assembly, as illustrated in FIG. 5A. The insulated enclosure 510 can comprise an insulation 512 that lines most of the enclosure 510. The insulation 512 can comprise a foam, a fiberglass insulation, and/or a heat reflecting barrier that is arranged to reflect heat back inside the insulated enclosure 510. Insulating foam can be flexible (e.g., Armaflex® foam sheet insulation) or can comprise an expanded polystyrene such as Styrofoam®. In some cases, the enclosure 510 can further include a shell 520 surrounding the insulation 512. The shell 520 can form an outer protective surface and can be made from a different material than the insulation 512 (e.g., a metal, polymer, or composite material such as fiberglass). In some implementations, the insulation 512 can be external to the shell 520. When an insulated enclosure 510 is used, the heating element 410 can be mounted to the bellows assembly 120 (as depicted in FIG. 5A), between the bellows assembly 120 and the insulated enclosure 510, or can be mounted to the insulated enclosure 510 (as depicted in FIG. 5B). In some implementations, the insulated enclosure 510 is sized to avoid interfering with motion of the deformable wall(s) 211, 212, 213 of the container 210 when the container expands and contracts.

The insulated enclosure 510 can be mounted on top of the tank 110, in some implementations. In such cases, heat from the tank that is captured by the insulated enclosure 510 may be sufficient to heat the bellows assembly 120 and prevent condensing of water vapor and/or coolant-liquid vapor 140 in the container 210. In such cases, a heater 190 and heating element 410 may not be included.

Figure 5C:
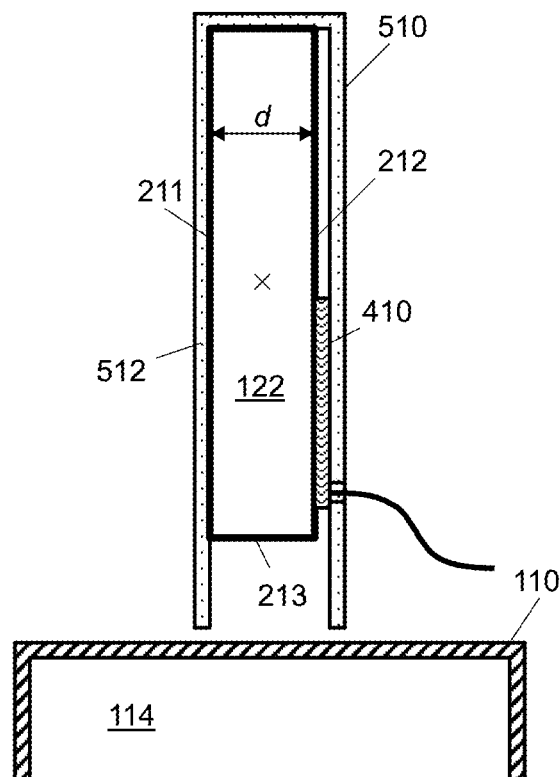
FIG. 5C illustrates an additional implementation of an insulating enclosure that can be placed around the bellows assembly of FIG. 2A.

In some implementations, the container 210 can be insulated with a flexible insulation layer applied to at least some of the walls of the container. FIG. 5C depicts such an implementation where flexible insulation 512 is applied to at least portions of at least three walls of the container 210. In some cases, the insulated enclosure 510 comprises an insulative blanket that fits over the bellows assembly 120. In an additional example, the flexible insulation 512 can be a sheet of insulation that is adhered to one or more walls of the container 210. In a further implementation, the insulation 512 can be sprayed onto and adhered to the walls of the container 210. In yet an additional example, the insulated enclosure 510 can be constructed to behave like a bellows and may or may not use an inflatable container 210 inside the enclosure 510. In such an example, the insulated enclosure 510 can have ports 124 and the pressure-release valve(s) 126 mounted directly on the enclosure 510.

Figure 5D:
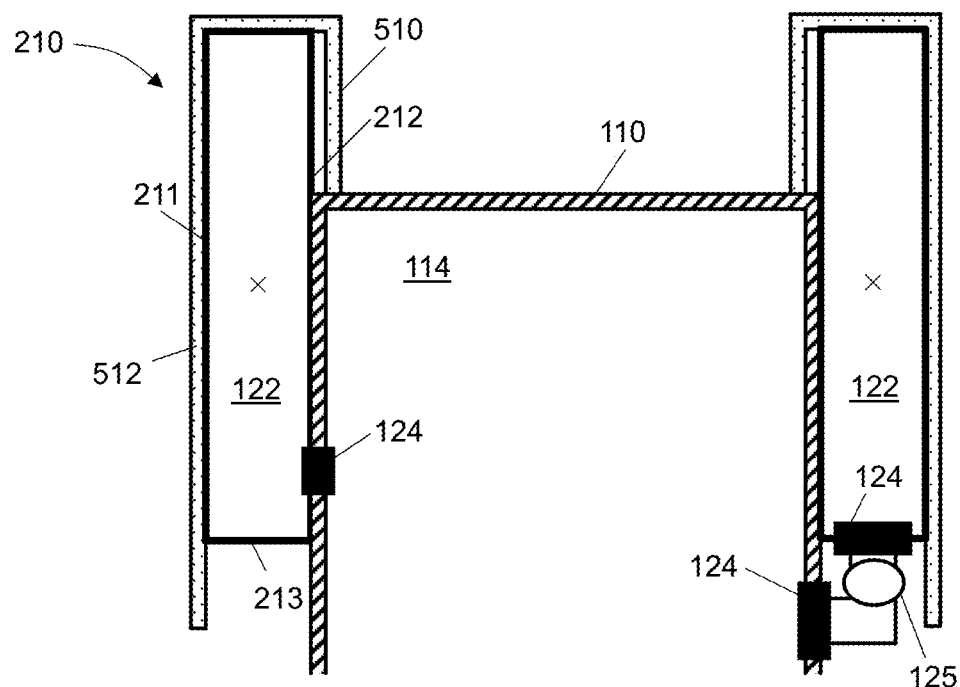
FIG. 5D illustrates an additional arrangement to provide heated to gas within the bellows assembly of FIG. 2A.

Another approach to heating the gas within the bellows volume 122 is to thermally couple at least a portion of one wall of the container 210 to a wall of the tank 110, as depicted in FIG. 5D. The wall 212 of the container 210 that thermally couples to the wall of the tank 110 may comprise a metal or other thermally conductive material. In some cases, a thermally-conductive adhesive or paste can be used to improve heat transfer from the tank 110 to the container 210. An insulation 512 can surround at least a portion of the container 210. One or more ports 124 can couple the air space 114 in the tank 110 to the bellows volume 122. The port(s) 124 can be located on a side of the container 210 (as illustrated in the arrangement on the left side of FIG. 5D) or can be located on a bottom wall 213 of the container and connect to another port through the side wall of the tank 110 (as illustrated in the arrangement on the right side of FIG. 5D). One or more isolation valves 125 can be used in the arrangement of FIG. 5D (e.g., included within a port 124 or located between a port 124 on the bottom wall 213 of the container 210 and the side wall of the tank 110).

According to some implementations, one or more walls 211, 212, 213 of the container 210 can be made from an insulative material, such as a closed-cell, flexible foam insulation that is impervious to gas flow. The ports 124 and the pressure-release valve(s) 126 can be mounted directly on the insulative walls of the container 210. There may or may not be additional insulation around the container 210.

Figure 6A:
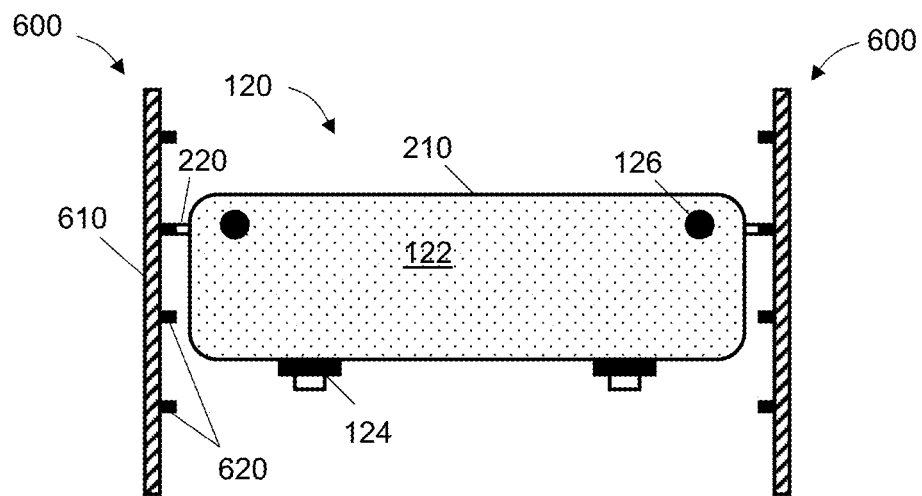
FIG. 6A depicts structure that can be used to support the bellows assembly of FIG. 2A.
Figure 6B:
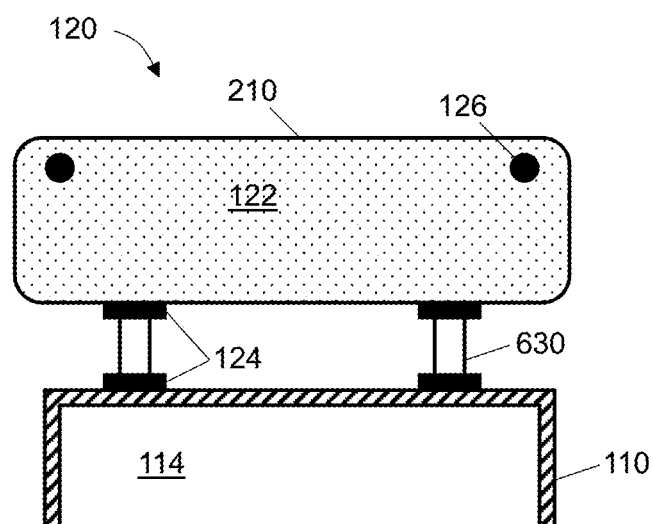
FIG. 6B depicts a further example of supporting the bellows assembly of FIG. 2A.

FIG. 6A depicts an example of support structure 600 that can be used to suspend or support one or more bellows assemblies 120 above a tank 110. Such a support structure can be used, for example, when flexible tubing is used to fluidically couple the container 210 to the tank 110 via ports 124. The support structure 600 comprises vertical risers 610 that include mounting hardware elements 620 (e.g., tabs, pins, holes, etc.) to couple to mounting hardware elements 220 on the container 210. In some implementations, horizontal struts having mounting hardware elements 620 could be used instead of the vertical risers 610 to engage with mounting hardware elements 220 on the container. There can be as few as one vertical riser 610 (or horizontal strut) at opposing ends or sides of the bellows assembly 120 to support the bellows assembly, though more vertical risers 610 and/or horizontal struts can be used. The support structure 600 may or may not be part of a framework that can be suspended from above (e.g., attached to overhead rails or other structure) or supported from below (e.g., mounted to the top of the tank 110 and/or to the floor on which the immersion-cooling system rests). In some cases, the support structure 600 can be supported from lateral structure (e.g., by walls or posts rising adjacent to the tank 110).

FIG. 6B depicts an example where the bellows assembly 120 is supported by one or more stiff conduits 630 (e.g., stiff tubes) that fluidically couple the bellows assembly to the tank 110. The conduit(s) 630 can connect to ports 124 on the bellows assembly 120 and tank 110. In such cases, no other support structure may be needed to support the bellows assembly. The stiff conduits 630 can comprise a metal and/or polymer and be of sufficient strength to support the bellows assembly 120 without collapsing.

Bellows for immersion cooling can be implemented in different configurations and operated according to different methods, some of which are listed below.

(1) A bellows assembly for a two-phase immersion cooling system, the bellows assembly comprising: a container comprising a polymer and enclosing a volume, the container having a first surface spanning a first surface area that encloses the volume, wherein at least a portion of the container is reversibly deformable to increase and decrease an amount of the volume enclosed by the container; a first wall comprising the polymer and having a second surface spanning a second surface area; a second wall having a third surface spanning a third surface area, the second wall separated from the first wall by at least a portion of the volume and oriented approximately parallel to the first wall when the volume is not under pressure or vacuum, wherein the second surface area and the third surface area comprise a majority of the first surface area; a third wall extending between and connected to the first wall and the second wall; at least one port in the third wall to admit gas into the volume and expel the gas from the volume; and at least one hardware element attached to at least one of the first wall, the second wall, and the third wall to mount the container in an orientation such that at least one of the first wall and the second wall deforms or deform outward from a center of the container without external hinderance when the volume is under pressure and deforms or deform inward without external hinderance when the volume is under vacuum.

(2) The bellows assembly of configuration (1), wherein the second wall and the third wall also comprise the polymer.

(3) The bellows assembly of configuration (1) or (2), wherein a port of the at least one port includes a port insert comprising: a flange that attaches to the third wall; a gasket; and a conduit passing through the third wall and sealed to the third wall with the flange and the gasket.

(4) The bellows assembly of configuration (3), wherein the conduit includes one or more holes along a length of the conduit located inside the container and the one or more holes are oriented such that gas flows into the container in a direction that is not normal to the first surface of the first wall and not normal to the second surface of the second wall.

(5) The bellows assembly of any one of configurations (1) through (4), wherein the at least one hardware element comprises a D-ring attached to an external surface of the container.

(6) The bellows assembly of any one of configurations (1) through (5), further comprising at least one pressure-release valve located within 10 cm from an edge of the first wall and fluidically coupled to the volume such that the gas can be released from the volume when pressure within the volume exceeds a threshold value.

(7) The bellows assembly of configuration (6), wherein a pressure-release valve of the at least one pressure-release valve is located within 10 cm of a top edge of the container such that, when the bellows assembly is in use in the two-phase immersion cooling system, the gas released from the volume contains a lower percentage of coolant-liquid vapor from coolant liquid used when the two-phase immersion cooling system is in operation than if the pressure-release valve of the at least one pressure-release valve were located at a lower elevation on the first wall.

(8) The bellows assembly of any one of configurations (1) through (7), further comprising: at least one pressure-release valve fluidically coupled to the volume such that the gas can be released from the volume when pressure within the volume exceeds a threshold value; and a vapor barrier arranged to transmit air to the pressure-release valve and to block passage of coolant-liquid vapor from coolant liquid used when the two-phase immersion cooling system is in operation.

(9) The bellows assembly of any one of configurations (1) through (8), wherein the first wall and second wall deform away from and toward each other in directions that are approximately horizontal, when the bellows assembly is in use in the two-phase immersion cooling system.

(10) The bellows assembly of any one of configurations (1) through (8), wherein the first wall and second wall deform away from and toward each other in directions that are approximately vertical, when the bellows assembly is in use in the two-phase immersion cooling system.

(11) The bellows assembly of any one of configurations (1) through (10) in a combination with a heater arranged to provide heat to the gas within the volume such that coolant-liquid vapor contained within the volume does not condense when the bellows assembly is in use in the two-phase immersion cooling system.

(12) The bellows assembly of configuration (11), wherein the heater comprises an electrical heating element thermally coupled to the bellows assembly.

(13) The bellows assembly of configuration (11), wherein the heater comprises a conduit to carry a heated liquid into and out of the container.

(14) The bellows assembly of any one of configurations (1) through (13), further including insulation arranged to thermally insulate at least a portion of the container from an external environment.

(15) The bellows assembly of any one of configurations (1) through (14), wherein at least one of the first wall, the second wall, and the third wall comprises thermal insulation.

(16) The bellows assembly of any one of configurations (1) through (15), including a vapor barrier fluidically coupled to the volume to capture at least one gaseous component within the gas.

(17) The bellows assembly of configuration (16), wherein the vapor barrier is an adsorbing filter or desiccant arranged to capture one or both of coolant-liquid vapor and water vapor from the gas admitted into the volume.

(18) The bellows assembly of configuration (16), wherein the vapor barrier is an activated filter to capture coolant-liquid vapor from coolant liquid used when the two-phase immersion cooling system is in operation.

(19) The bellows assembly of any one of configurations (1) through (18), wherein a thickness of the first wall between 100 microns and 3 millimeters.

(20) The bellows assembly of any one of configurations (1) through (19), wherein the polymer comprises polyurethane.

(21) The bellows assembly of any one of configurations (1) through (20), wherein the first wall and the second wall have a same rectangular shape.

(22) The bellows assembly of any one of configurations (1) through (21), wherein an area of the first surface is greater than 0.2 m$_2$.

(23) A method of regulating pressure in a two-phase immersion cooling system, the method comprising: receiving gas through a port and into a volume enclosed by a container of a bellows assembly in response to an increase in pressure of the gas, the container having a first surface spanning a first surface area that encloses the volume; deforming a first wall of the container in a first direction to increase the volume while receiving the gas, wherein the first wall comprises a polymer and has a second surface spanning a second surface area; expelling the gas from the volume in response to a decrease in pressure of the gas; and deforming the first wall of the container in a second direction opposite the first direction to decrease the volume while expelling the gas, wherein: the container includes a second wall having a third surface spanning a third surface area, the second wall being separated from the first wall by at least a portion of the volume and oriented approximately parallel to the first wall when the volume is not under pressure or vacuum, the second surface area and the third surface area comprise a majority of the first surface area, the container further includes a third wall extending between and connected to the first wall and the second wall, and the bellows assembly includes at least one hardware element attached to at least one of the first wall, the second wall, and the third wall to mount the container in an orientation such that at least one of the first wall and the second wall deforms or deform outward from a center of the container without external hinderance when the volume is under pressure and deforms or deform inward without external hinderance when the volume is under vacuum.

(24) The method of (23), wherein the second wall and the third wall also comprise the polymer.

(25) The method of (23) or (24), further comprising: directing the gas received into the volume such that the gas flows into the container in a direction that is not normal to the first surface of the first wall and not normal to the second surface of the second wall.

(26) The method of any one of (23) through (25), further comprising: releasing, with a pressure-release valve, gas from the volume into an ambient atmosphere outside the container when pressure of the gas in the volume exceeds a threshold value, wherein the pressure-release valve is located is located within 10 cm of a top edge of the container such that the gas released from the volume contains a lower percentage of coolant-liquid vapor from coolant liquid used in the two-phase immersion cooling system than if the pressure-release valve were located at a lower elevation on the container.

(27) The method of (26), further comprising: blocking passage of the coolant-liquid vapor to the pressure-release valve with a vapor barrier; and transmitting air molecules through the vapor barrier to the pressure-release valve.

(28) The method of any one of (23) through (27), wherein the first wall and second wall deform away from each other and toward each other in directions that are approximately horizontal when receiving the gas into the volume and when expelling the gas from the volume, respectively.

(29) The method of any one of (23) through (27), wherein the first wall and second wall deform away from each other and toward each other in directions that are approximately vertical when receiving the gas into the volume and when expelling the gas from the volume, respectively.

(30) The method of any one of (23) through (29), further comprising: providing heat to the gas within the volume such that coolant-liquid vapor contained within the volume does not condense when the bellows assembly is in use in the two-phase immersion cooling system.

(31) The method of any one of (23) through (30), further comprising providing the heat with an electrical heating element thermally coupled to the bellows assembly.

(32) The method of any one of (23) through (31), further comprising providing the heat with a conduit carrying a heated liquid into and out of the container.

(33) The method of any one of (23) through (32), further comprising retaining heat in the container with insulation arranged to thermally insulate at least a portion of the container from an external environment.

(34) The method of any one of (23) through (33), further comprising capturing, with a vapor barrier fluidically coupled to the volume, at least one gaseous component within the gas.

(35) A two-phase immersion cooling system comprising: a tank to contain one or more printed circuit boards having one or more semiconductor dies to be cooled during operation of the semiconductor die(s); coolant liquid within the tank that immerses the one or more printed circuit boards; air space within the tank above the coolant liquid; and a bellows assembly fluidically coupled to the air space and forming a normally-closed first volume that includes the air space, the bellows assembly comprising: a container comprising a polymer and enclosing a second volume that is a portion of the first volume, the container having a first surface spanning a first surface area that encloses the second volume, wherein at least a portion of the container is reversibly deformable to increase and decrease an amount of the second volume enclosed by the container; a first wall comprising the polymer and having a second surface spanning a second surface area; a second wall having a third surface spanning a third surface area, the second wall separated from the first wall by at least a portion of the second volume and oriented approximately parallel to the first wall when the first volume is not under pressure or vacuum, wherein the second surface area and the third surface area comprise a majority of the first surface area; a third wall extending between and connected to the first wall and the second wall; at least one port in the third wall to admit gas into the second volume from the air space when the first volume is under pressure and expel the gas from the second volume into the air space when the first volume is under vacuum; and at least one hardware element attached to at least one of the first wall, the second wall, and the third wall to mount the container in an orientation such that at least one of the first wall and the second wall deforms or deform outward from a center of the container without external hinderance when the first volume is under pressure and deforms or deform inward without external hinderance when the first volume is under vacuum.

(36) The two-phase immersion cooling system of configuration (35), wherein the second wall and the third wall also comprise the polymer.

(37) The two-phase immersion cooling system of configuration (35) or (36), wherein a port of the at least one port includes a port insert comprising: a flange that attaches to the third wall; a gasket; and a conduit passing through the third wall and sealed to the third wall with the flange and the gasket.

(38) The two-phase immersion cooling system of configuration (37), wherein the conduit includes one or more holes along a length of the conduit located inside the container and the one or more holes are oriented such that gas flows into the container in a direction that is not normal to the first surface of the first wall and not normal to the second surface of the second wall.

(39) The two-phase immersion cooling system of any one of configurations (35) through (38), wherein the at least one hardware element comprises a D-ring attached to an external surface of the container.

(40) The two-phase immersion cooling system of any one of configurations (35) through (38), further comprising at least one pressure-release valve located within 10 cm from an edge of the first wall and fluidically coupled to the volume such that the gas can be released from the volume when pressure within the volume exceeds a threshold value.

(41) The two-phase immersion cooling system of configuration (40), wherein a pressure-release valve of the at least one pressure-release valve is located within 10 cm of a top edge of the container such that, when the bellows assembly is in use in the two-phase immersion cooling system, the gas released from the volume contains a lower percentage of coolant-liquid vapor from coolant liquid used when the two-phase immersion cooling system is in operation than if the pressure-release valve of the at least one pressure-release valve were located at a lower elevation on the first wall.

(42) The two-phase immersion cooling system of any one of configurations (35) through (41), further comprising: at least one pressure-release valve fluidically coupled to the volume such that the gas can be released from the volume when pressure within the volume exceeds a threshold value; and a vapor barrier arranged to transmit air to the pressure-release valve and to block passage of coolant-liquid vapor from coolant liquid used when the two-phase immersion cooling system is in operation.

(43) The two-phase immersion cooling system of any one of configurations (35) through (42), further comprising at least one isolation valve arranged to isolate the air space in the tank from the second volume.

(44) The two-phase immersion cooling system of configuration (43), further comprising: an access door on the tank to access an interior region of the tank; a sensor to detect opening of the access door; and a controller to receive a signal from the sensor indicating the opening of the access door and issue a command signal to activate the at least one isolation valve in response to receiving the signal, wherein activation of the at least one isolation valve isolates the air space in the tank from the second volume.

(45) The two-phase immersion cooling system of any one of configurations (35) through (44), wherein the first wall and second wall deform away from and toward each other in directions that are approximately horizontal, when the bellows assembly is in use in the two-phase immersion cooling system.

(46) The two-phase immersion cooling system of any one of configurations (35) through (45), wherein the first wall and second wall deform away from and toward each other in directions that are approximately vertical, when the bellows assembly is in use in the two-phase immersion cooling system.

(47) The two-phase immersion cooling system of any one of configurations (35) through (46) in a combination with a heater arranged to provide heat to the gas within the volume such that coolant-liquid vapor contained within the volume does not condense when the bellows assembly is in use in the two-phase immersion cooling system.

(48) The two-phase immersion cooling system of configuration (47), wherein the heater comprises an electrical heating element thermally coupled to the bellows assembly.

(49) The two-phase immersion cooling system of configuration (47), wherein the heater comprises a conduit to carry a heated liquid into and out of the container.

(50) The two-phase immersion cooling system of any one of configurations (35) through (49), wherein at least a portion of one wall of the container is thermally coupled to a wall of the tank.

(51) The two-phase immersion cooling system of any one of configurations (35) through (50), further including insulation arranged to thermally insulate at least a portion of the container from an external environment.

(52) The two-phase immersion cooling system of any one of configurations (35) through (51), wherein at least one of the first wall, the second wall, and the third wall comprises thermal insulation.

(53) The two-phase immersion cooling system of any one of configurations (35) through (52), including a vapor barrier fluidically coupled to the volume to capture at least one gaseous component within the gas.

(54) The two-phase immersion cooling system of configuration (53), wherein the vapor barrier is an adsorbing filter or desiccant arranged to capture one or both of coolant-liquid vapor and water vapor from the gas admitted into the volume.

(55) The two-phase immersion cooling system of configuration (54), wherein the vapor barrier is an activated filter to capture coolant-liquid vapor from coolant liquid used when the two-phase immersion cooling system is in operation.

(56) The two-phase immersion cooling system of any one of configurations (35) through (55), wherein a thickness of the first wall between 100 microns and 3 millimeters.

(57) The two-phase immersion cooling system of any one of configurations (35) through (56), wherein the polymer comprises polyurethane.

(58) The two-phase immersion cooling system of any one of configurations (35) through (57), wherein the first wall and the second wall have a same rectangular shape.

(59) The two-phase immersion cooling system of any one of configurations (35) through (58), wherein an area of the first surface is greater than 0.2 m$^2$.

(60) A method of cooling semiconductor dies in a tank of a two-phase immersion cooling system, the method comprising: receiving heat from the semiconductor dies into a coolant liquid within the tank, the coolant liquid filling a portion of the tank below an air space occupying a top region of the tank; receiving gas from the air space into a volume enclosed by a container of a bellows assembly in response to an increase in pressure of the gas, wherein the bellows assembly includes a port fluidically coupled to the air space and the container has a first surface spanning a first surface area that encloses the volume; deforming a first wall of the container in a first direction to increase the volume while receiving the gas, wherein the first wall comprises a polymer and has a second surface spanning a second surface area; expelling the gas from the volume in response to a decrease in pressure of the gas; and deforming the first wall of the container in a second direction opposite the first direction to decrease the volume while expelling the gas, wherein: the container includes a second wall having a third surface spanning a third surface area, the second wall being separated from the first wall by at least a portion of the volume and oriented approximately parallel to the first wall when the volume is not under pressure or vacuum, the second surface area and the third surface area comprise a majority of the first surface area, the container further includes a third wall extending between and connected to the first wall and the second wall, and the bellows assembly further includes at least one hardware element attached to at least one of the first wall, the second wall, and the third wall to mount the container in an orientation such that at least one of the first wall and the second wall deforms or deform outward from a center of the container without external hinderance when the volume is under pressure and deforms or deform inward without external hinderance when the volume is under vacuum.

(61) The method of (60), wherein the second wall and the third wall also comprise the polymer.

(62) The method of (60) or (61), further comprising directing the gas received into the volume such that the gas flows into the container in a direction that is not normal to the first surface of the first wall and not normal to the second surface of the second wall.

(63) The method of any one of (60) through (62), further comprising releasing, with a pressure-release valve, gas from the volume into an ambient atmosphere outside the container when pressure of the gas in the volume exceeds a threshold value, wherein the pressure-release valve is located is located within 10 cm of a top edge of the container such that the gas released from the volume contains a lower percentage of coolant-liquid vapor from coolant liquid used in the two-phase immersion cooling system than if the pressure-release valve were located at a lower elevation on the container.

(64) The method of (63), further comprising: blocking passage of the coolant-liquid vapor to the pressure-release valve with a vapor barrier; and transmitting air molecules through the vapor barrier to the pressure-release valve.

(65) The method of any one of (60) through (64), wherein the first wall and second wall deform away from each other and toward each other in directions that are approximately horizontal when receiving the gas into the volume and when expelling the gas from the volume, respectively.

(66) The method of any one of (60) through (65), wherein the first wall and second wall deform away from each other and toward each other in directions that are approximately vertical when receiving the gas into the volume and when expelling the gas from the volume, respectively.

(67) The method of any one of (60) through (66), further comprising: providing heat to the gas within the volume such that coolant-liquid vapor contained within the volume does not condense when the bellows assembly is in use in the two-phase immersion cooling system.

(68) The method of (67), further comprising: providing the heat with an electrical heating element thermally coupled to the bellows assembly.

(69) The method of (60) through (68), further comprising: providing the heat with a conduit carrying a heated liquid into and out of the container.

(70) The method of any one of (60) through (69), further comprising retaining heat in the container with insulation arranged to thermally insulate at least a portion of the container from an external environment.

(71) The method of any one of (60) through (70), further comprising capturing, with a vapor barrier fluidically coupled to the volume, at least one gaseous component within the gas.

(72) The method of any one of (60) through (71), further comprising: detecting, with a sensor, access to the air space; and automatically isolating the volume from the air space with at least one isolation valve in response to receiving a signal from the sensor indicating the access to the air space.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain, using no more than routine experimentation, many equivalents to the specific inventive embodiments described herein. It is, therefore, to be understood that the foregoing embodiments are presented by way of example only and that inventive embodiments may be practiced otherwise than as specifically described. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

Unless stated otherwise, the terms "approximately" and "about" are used to mean within ±20% of a target (e.g., dimension or orientation) in some embodiments, within ±10% of a target in some embodiments, within ±5% of a target in some embodiments, and yet within ±2% of a target in some embodiments. The terms "approximately" and "about" can include the target. The term "essentially" is used to mean within ±3% of a target.

The indefinite articles "a" and "an," as used herein, unless clearly indicated to the contrary, should be understood to mean "at least one."

The phrase "and/or," as used herein, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of" or "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of." "Consisting essentially of," shall have its ordinary meaning as used in the field of patent law.

As used herein, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A method of cooling semiconductor dies in a tank of a two-phase immersion cooling system, the method comprising:

receiving heat from the semiconductor dies into a coolant liquid within the tank, the coolant liquid filling a portion of the tank below an air space occupying a top region of the tank;

receiving gas from the air space into a volume enclosed by a container of a bellows assembly in response to an increase in pressure of the gas, wherein the bellows assembly includes a port fluidically coupled to the air space and the container has a first surface spanning a first surface area that encloses the volume;

deforming a first wall of the container in a first direction to increase the volume while receiving the gas, wherein the first wall comprises a polymer and has a second surface spanning a second surface area;

expelling the gas from the volume in response to a decrease in pressure of the gas; and deforming the first wall of the container in a second direction opposite the first direction to decrease the volume while expelling the gas, wherein:

the container includes a second wall having a third surface spanning a third surface area, the second wall being separated from the first wall by at least a portion of the volume and oriented approximately parallel to the first wall when the volume is not under pressure or vacuum, the second surface area and the third surface area comprise a majority of the first surface area, the container further includes a third wall extending between and connected to the first wall and the second wall, and the bellows assembly further includes at least one hardware element attached to at least one of the first wall, the second wall, and the third wall to mount the container in an orientation such that at least one of the first wall and the second wall deforms or deform outward from a center of the container without external hinderance when the volume is under pressure and deforms or deform inward without external hinderance when the volume is under vacuum.

2. The method of claim 1, wherein the second wall and the third wall also comprise the polymer.

3. The method of claim 1, wherein the polymer comprises polyurethane.

4. The method of claim 1, wherein the polymer comprises mylar.

5. The method of claim 1, wherein the polymer comprises polyethylene.

6. The method of claim 1, wherein the polymer comprises silicone.

7. The method of claim 1, wherein a thickness of the first wall between 100 microns and 3 millimeters.

8. The method of claim 1, wherein the first wall and the second wall are separated by a distance in a range from 100 mm to 500 mm.

9. The method of claim 1, further comprising:
directing the gas received into the volume such that the gas flows into the container in a direction that is not normal to the first surface of the first wall and not normal to the second surface of the second wall.

10. The method of claim 1, further comprising:
releasing, with a pressure-release valve, gas from the volume into an ambient atmosphere outside the container when pressure of the gas in the volume exceeds a threshold value, wherein the pressure-release valve is located is located within 10 cm of a top edge of the container such that the gas released from the volume contains a lower percentage of coolant-liquid vapor from coolant liquid used in the two-phase immersion cooling system than if the pressure-release valve were located at a lower elevation on the container.

11. The method of claim 10, further comprising:
blocking passage of the coolant-liquid vapor to the pressure-release valve with a vapor barrier; and
transmitting air molecules through the vapor barrier to the pressure-release valve.

12. The method of claim 1, wherein the first wall and second wall deform away from each other and toward each other in directions that are approximately horizontal when receiving the gas into the volume and when expelling the gas from the volume, respectively.

13. The method of claim 1, wherein the first wall and second wall deform away from each other and toward each other in directions that are approximately vertical when receiving the gas into the volume and when expelling the gas from the volume, respectively.

14. The method of claim 1, further comprising:
providing heat to the gas within the volume such that coolant-liquid vapor contained within the volume does not condense when the bellows assembly is in use in the two-phase immersion cooling system.

15. The method of claim 14, further comprising:
providing the heat with an electrical heating element thermally coupled to the bellows assembly.

16. The method of claim 14, further comprising:
providing the heat with a conduit carrying a heated liquid into and out of the container.

17. The method of claim 14, further comprising:
providing the heat via thermal coupling of a wall of the container with a wall of the tank.

18. The method of claim 1, further comprising:
retaining heat in the container with insulation arranged to thermally insulate at least a portion of the container from an external environment.

19. The method of claim 1, further comprising:
capturing, with a vapor barrier fluidically coupled to the volume, at least one gaseous component within the gas.

20. The method of claim 1, further comprising:
detecting, with a sensor, access to the air space; and
automatically isolating the volume from the air space with at least one isolation valve in response to receiving a signal from the sensor indicating the access to the air space.

21. The method of claim 20, wherein the access to the air space comprises opening an access door to the air space within the tank.

22. The method of claim 20, wherein the sensor detects movement of an access door to the air space.

23. The method of claim 22, further comprising:
detecting, with the sensor, closing of the access door to the air space; and
automatically coupling the volume to the air space with the at least one isolation valve in response to receiving a signal from the sensor indicating the closing of the access door.

* * * * *